United States Patent
Yue et al.

(10) Patent No.: US 9,105,443 B2
(45) Date of Patent: Aug. 11, 2015

(54) MULTI-STEP LOCATION SPECIFIC PROCESS FOR SUBSTRATE EDGE PROFILE CORRECTION FOR GCIB SYSTEM

(71) Applicant: TEL Epion Inc., Billerica, MA (US)

(72) Inventors: Hongyu H. Yue, Plano, TX (US); Noel Russell, Waterford, NY (US); Vincent Gizzo, East Greenbush, NY (US); Joshua LaRose, Albany, NY (US); Steven P. Caliendo, Ashby, MA (US)

(73) Assignee: TEL Epion Inc., Billerica, MA (US)

( * ) Notice: Subject to any disclaimer, the term of this patent is extended or adjusted under 35 U.S.C. 154(b) by 0 days.

(21) Appl. No.: 14/548,550

(22) Filed: Nov. 20, 2014

(65) Prior Publication Data

US 2015/0137006 A1   May 21, 2015

Related U.S. Application Data

(60) Provisional application No. 61/915,894, filed on Dec. 13, 2013, provisional application No. 61/906,610, filed on Nov. 20, 2013.

(51) Int. Cl.
*G21K 5/00* (2006.01)
*H01J 37/20* (2006.01)
*H01J 37/317* (2006.01)
*H01J 37/305* (2006.01)

(52) U.S. Cl.
CPC ............... *H01J 37/20* (2013.01); *H01J 37/305* (2013.01); *H01J 37/3171* (2013.01)

(58) Field of Classification Search
USPC ............. 250/491.1, 492.1, 492.2, 492.22, 250/492.21, 492.23, 492.3
See application file for complete search history.

(56) References Cited

U.S. PATENT DOCUMENTS

| | | | |
|---|---|---|---|
| 7,060,989 B2 | 6/2006 | Swenson et al. | |
| 7,173,252 B2 | 2/2007 | Mack | |
| 7,553,763 B2 | 6/2009 | Hsiao et al. | |
| 7,608,843 B2 | 10/2009 | Freytsis et al. | |
| 7,692,164 B2 | 4/2010 | Halling | |
| 7,948,734 B2 | 5/2011 | Regan | |
| 8,169,769 B2 | 5/2012 | Regan | |
| 8,293,126 B2 | 10/2012 | MacCrimmon et al. | |
| 8,847,148 B2 | 9/2014 | Kirkpatrick et al. | |
| 2009/0321658 A1* | 12/2009 | Kirkpatrick et al. | 250/455.11 |
| 2012/0045615 A1 | 2/2012 | Kirkpatrick et al. | |
| 2012/0223249 A1* | 9/2012 | Gwinn et al. | 250/453.11 |
| 2014/0236295 A1* | 8/2014 | Khoury et al. | 623/13.11 |

OTHER PUBLICATIONS

International Searching Authority, International Search Report and Written Opinion issued in corresponding Application No. PCT/US14/66563 dated Apr. 8, 2015, 12 pp.

* cited by examiner

*Primary Examiner* — Nicole Ippolito
(74) *Attorney, Agent, or Firm* — Wood, Herron & Evans, LLP

(57) ABSTRACT

Disclosed are an apparatus, system, and method for scanning a substrate or other workpiece through a gas-cluster ion beam (GCIB), or any other type of ion beam. The workpiece scanning apparatus is configured to receive and hold a substrate for irradiation by the GCIB and to scan it through the GCIB in two directions using two movements: a reciprocating fast-scan movement, and a slow-scan movement. The slow-scan movement is actuated using a servo motor and a belt drive system, the belt drive system being configured to reduce the failure rate of the workpiece scanning apparatus.

11 Claims, 18 Drawing Sheets

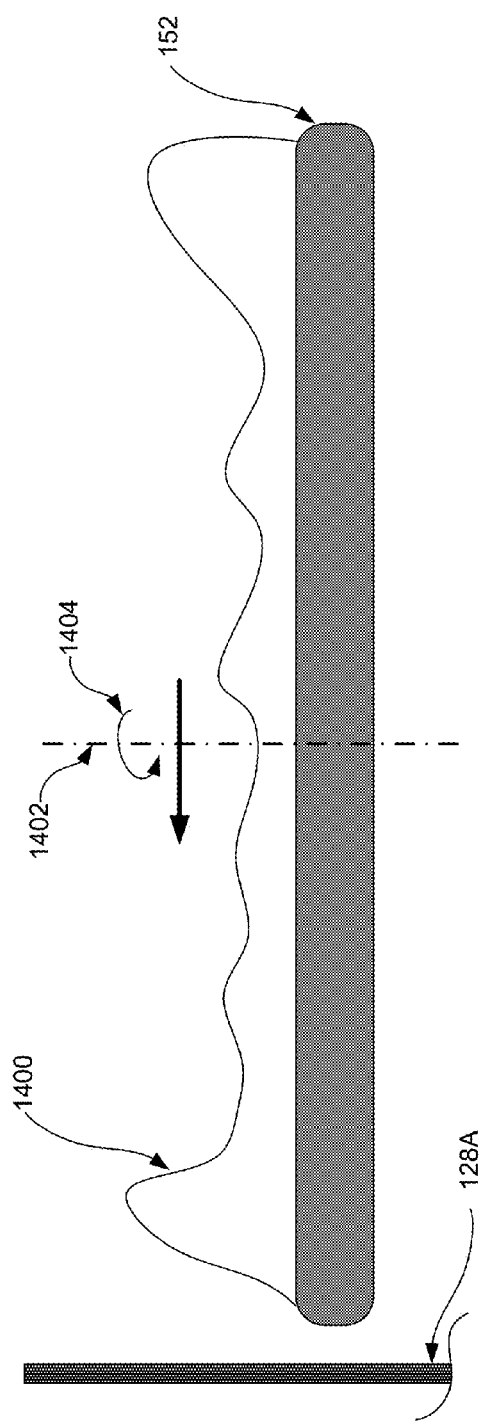
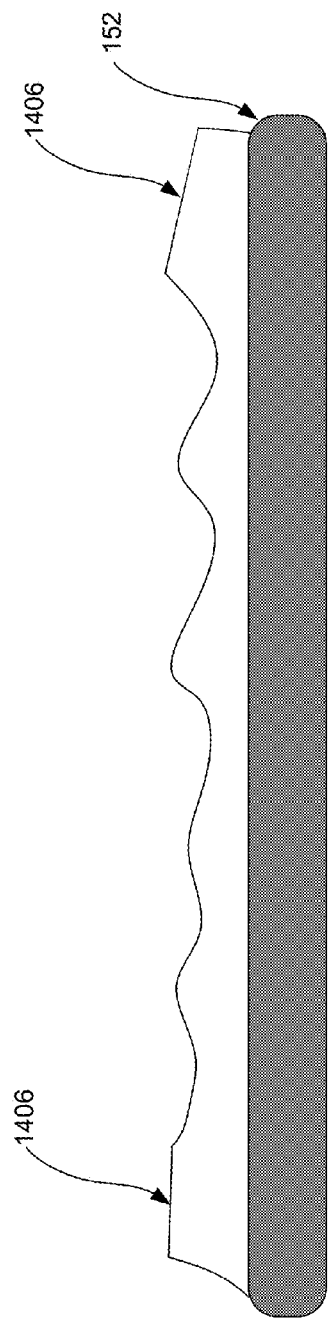
FIG. 14A
FIG. 14B

MULTI-STEP LOCATION SPECIFIC PROCESS FOR SUBSTRATE EDGE PROFILE CORRECTION FOR GCIB SYSTEM

CROSS REFERECNCE TO RELATED APPLICATIONS

Pursuant to 37 C.F.R §1.78(a)(4), this application claims the benefit of and priority to filed Provisional Application Ser. No. 61/906,610 filed Nov. 20, 2013 and Provisional Application Ser. No. 61/915,894 filed Dec. 13, 2013.

FIELD OF THE INVENTION

This invention relates to a system and method for irradiating substrates using a gas cluster ion beam (GCIB), and more specifically to an improved apparatus, system, and method for scanning of a substrate through the GCIB.

BACKGROUND

Gas cluster ion beams (GCIB's) are used for doping, etching, cleaning, smoothing, and growing or depositing layers on a substrate. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electronic charge and an integer greater than or equal to one that represents the charge state of the cluster ion. The larger sized cluster ions are often the most useful because of their ability to carry substantial energy per cluster ion, while yet having only modest energy per individual molecule. The ion clusters disintegrate on impact with the substrate. Each individual molecule in a particular disintegrated ion cluster carries only a small fraction of the total cluster energy. Consequently, the impact effects of large ion clusters are substantial, but are limited to a very shallow surface region. This makes gas cluster ions effective for a variety of surface modification processes, but without the tendency to produce deeper sub-surface damage that is characteristic of conventional ion beam processing.

Related U.S. patent application Ser. No. 11/565,267, entitled "METHOD AND APPARATUS FOR SCANNING A WORKPIECE THROUGH AN ION BEAM", filed on Nov. 30, 2006, issued as U.S. Pat. No. 7,608,843 on Oct. 27, 2009, and incorporated by reference herein in its entirety, describes a workpiece scanning mechanism for scanning workpieces, such as wafers, substrates, etc., through a gas cluster ion beam (GCIB). The scanner described therein has two movements which in combination allow every point of the workpiece to be reached by the GCIB. The first movement is a fast reciprocating movement of the workpiece through the GCIB (i.e. the fast-scan movement), with the workpiece attached to an arm akin to an inverted pendulum; the resultant path of the GCIB across the workpiece having an arcuate shape. The second movement is a slow linear movement of the center of rotation of the arm (i.e. the slow-scan movement), which causes different parallel arcuate paths to be traced by the GCIB across the workpiece, thereby allowing processing of the entire area of the workpiece. The fast-scan movement motor and center of rotation of the arm holding the workpiece, of the embodiments described therein, is mounted on a shuttle of a vertical shuttle drive assembly, wherein upwards movement thereof is actuated by a slow-scan servo motor pulling the shuttle upwards via a pulley and belt. Downwards movement, however, is accomplished by relying on gravity, i.e. the slow-scan servo motor unwinding the belt from the pulley, thereby allowing the shuttle, fast-scan motor, and arm to move together downwards.

Such a workpiece scanning mechanism has a number of drawbacks. For example, the slow-scan movement can only be in the vertical or near-vertical direction, due to reliance on gravity for at least one direction of the slow-scan movement. Secondly, contamination or failure of the shuttle drive assembly can cause the slow-scan movement to jam at some position of the shuttle along the rail of the shuttle drive assembly, the force of gravity in some cases being unable to pull the shuttle, fast-scan motor, and arm downwards as the process recipe requires, resulting in a workpiece not being processed correctly. Even worse, if gravity at some point does overcome the jammed shuttle, and if a sufficient length of belt has been previously un-wound from the pulley, the entire shuttle, fast-scan motor, and arm carrying the workpiece can suddenly free fall, causing excessive force to be applied to the belt, pulley, and slow-scan servo motor, typically leading to slow-scan servo motor failure.

The present invention seeks to rectify the aforementioned shortcomings of the gravity-assisted workpiece scanning mechanism.

SUMMARY OF THE INVENTION

One aspect of the invention is an apparatus for scanning a workpiece through a GCIB, comprising an elongated member adapted to mount a workpiece; a rotational mechanism mounting the elongated member at a point of rotation and configured to repetitively scan the workpiece through the GCIB along an arcuate path; a slow-scan mechanism suspending the elongated member and rotational mechanism, and configured to cause linear movement of the rotational mechanism and the elongated member, to cause different portions of the workpiece to pass through the GCIB, the slow-scan mechanism comprising a shuttle drive assembly having a rail and a shuttle, the rotational mechanism being attached to and suspended by the shuttle; a first pulley; a second pulley; a belt mounted over the pulleys and attached to the shuttle; and a drive mechanism to actuate the belt.

Another aspect of the invention is an apparatus in which the drive mechanism comprises a servo motor having a drive shaft; a first sprocket attached to the drive shaft; a vacuum rotary feedthrough; a second sprocket attached to the vacuum rotary feedthrough; and a geared belt mounted over the first and second sprockets.

Another aspect of the invention is a system for processing workpieces using a GCIB, comprising a nozzle to form a gas cluster beam from a gas; a skimmer for removing undesired gas clusters from the gas cluster beam; an ionizer to ionize the gas cluster beam and form a GCIB; an accelerator to accelerate the GCIB; a workpiece scanning mechanism enclosed in a processing chamber and configured to scan the workpiece through the GCIB, the workpiece scanning mechanism comprising an elongated member adapted to mount a workpiece; a rotational mechanism mounting the elongated member at a point of rotation and configured to repetitively scan the workpiece through the GCIB along an arcuate path; a slow-scan mechanism suspending the elongated member and rotational mechanism, and configured to cause linear movement of the rotational mechanism and the elongated member, to cause different portions of the workpiece to pass through the GCIB, the slow-scan mechanism comprising a shuttle drive assembly having a rail and a shuttle, the rotational mechanism being attached to and suspended by the shuttle; a first pulley; a second pulley; a belt mounted over the pulleys and attached to the shuttle; and a drive mechanism to actuate the belt.

Yet another aspect of the invention is a method for scanning a workpiece through an ion beam, comprising the steps of mounting a workpiece within an GCIB path at an end of an elongated member; partially, repetitively rotating the elongated member using a rotational mechanism attached to a point of rotation on the elongated member, to make repetitive scans of the workpiece through the GCIB, along an arcuate path; moving the elongated member and rotational mechanism along a slow-scan mechanism, to which the rotational mechanism is attached and is suspended by, the moving causing different portions of the workpiece to pass through the GCIB path during the repetitive scans, the slow-scan mechanism comprising a shuttle drive assembly having a rail and a shuttle, the rotational mechanism being attached to and suspended by the shuttle; a first pulley; a second pulley; a belt mounted over the pulleys and attached to the shuttle; and a drive mechanism to actuate the belt, wherein the moving includes actuating the drive mechanism and the belt so as to cause linear movement of the shuttle along the rail.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 14A illustrates a simplified exemplary embodiment of implementing the circular scan on the substrate that has an exemplary thickness profile.

FIG. 14B illustrates an exemplary result of using the circular scan on the thickness profile of the substrate.

DETAILED DESCRIPTION OF EXEMPLARY EMBODIMENTS

In the following description, in order to facilitate a thorough understanding of the invention and for purposes of explanation and not limitation, specific details are set forth, such as particular geometries of a lithography, coater/developer, and gap-fill treatment system, and descriptions of various components and processes. However, it should be understood that the invention may be practiced in other embodiments that depart from these specific details.

In the following description, the terms ion beam and gas cluster ion beam (GCIB) will be used interchangeably, as the workpiece scanning mechanism described herein can be used for processing workpieces using ordinary (i.e. monomer) ion beams and gas cluster ion beams (GCIB).

In the following description, the terms workpiece, substrate, and wafer will be used interchangeably, to denote a workpiece being processed by an ion beam or gas cluster ion beam (GCIB). The workpiece can include a conductive, semiconductive, or dielectric substrate, with or without various patterned or unpatterned films formed thereupon. Further, the workpiece can be of any shape, e.g. circular, rectangular, etc., and size, e.g. a circular wafer of 6 inches, 8 inches, 12 inches, or higher diameter. Example workpieces include wafers or semiconductor wafers, flat panel displays (FPD), liquid crystal displays (LCD), etc.

Figure 1:
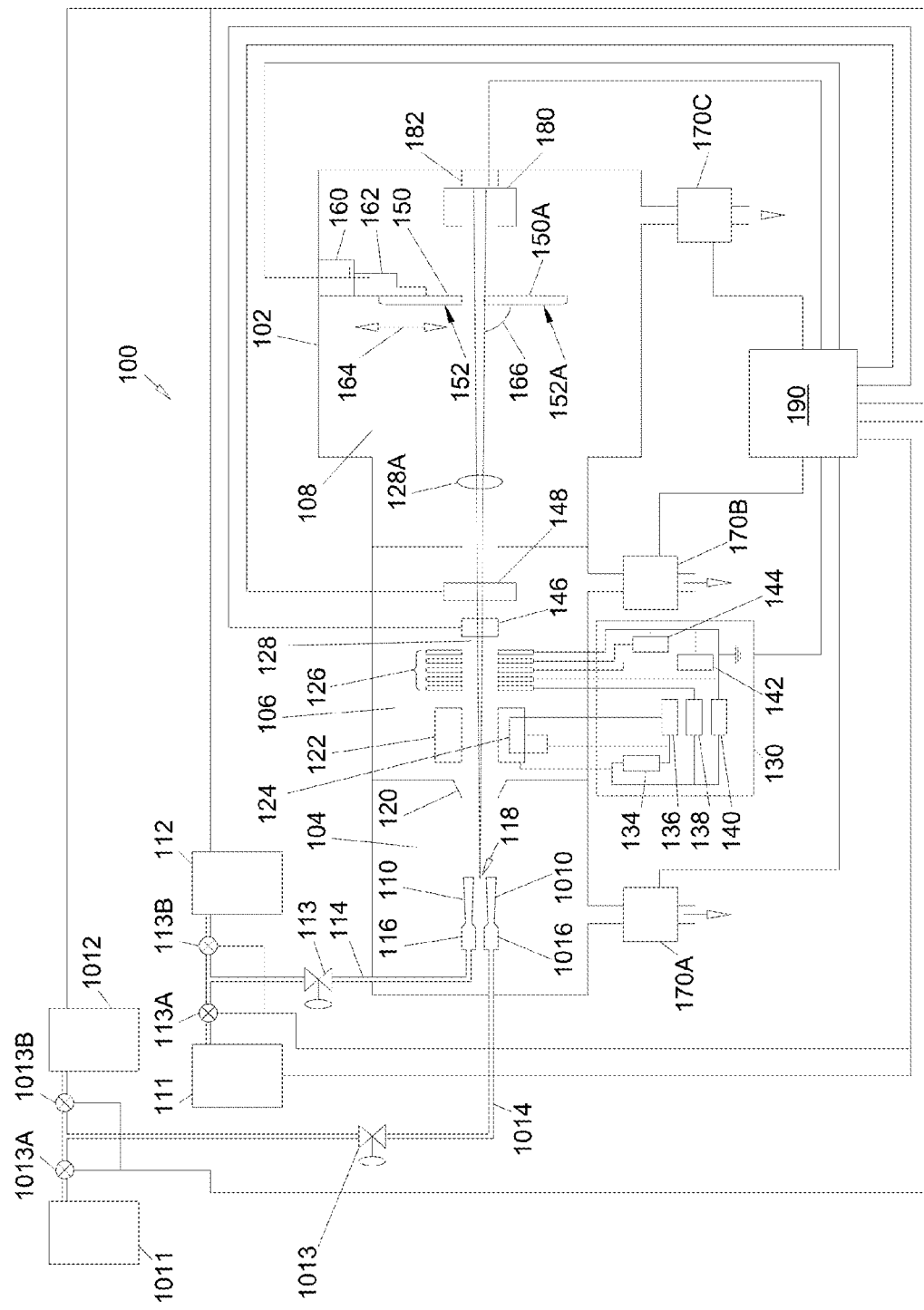
FIG. 1 is a schematic of a multiple nozzle GCIB system in accordance with an embodiment of the invention.

Referring now to FIG. 1, a GCIB processing system 100 for modifying, depositing, growing, or doping a layer is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 1, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

In the exemplary embodiment of FIG. 1, GCIB processing system 100 comprises two gas supplies 115, 1015 and two nozzles 116, 1016. Additional embodiments will be discussed later having numbers of nozzles different than two, and numbers of gas supplies different than two, all of which fall within the scope of the invention. Each of the two gas supplies 115 and 1015 is connected to one of two stagnation chambers 116 and 1016, and nozzles 110 and 1010, respectively. The first gas supply 115 comprises a first gas source 111, a second gas source 112, a first gas control valve 116A, a second gas control valve 113B, and a gas metering valve 113. For example, a first gas composition stored in the first gas source 111 is admitted under pressure through a first gas control valve 113A to the gas metering valve or valves 113. Additionally, for example, a second gas composition stored in the second gas source 112 is admitted under pressure through the second gas control valve 113B to the gas metering valve or valves 113. Further, for example, the first gas composition or second gas composition, or both, of first gas supply 115 can include a condensable inert gas, carrier gas or dilution gas. For example, the inert gas, carrier gas or dilution gas can include a noble gas, i.e., He, Ne, Ar, Kr, Xe, or Rn.

Similarly, the second gas supply 1015 comprises a first gas source 1011, a second gas source 1012, a first gas control valve 1013A, a second gas control valve 1013B, and a gas metering valve 1013. For example, a first gas composition stored in the first gas source 1011 is admitted under pressure through the first gas control valve 1013A to the gas metering valve or valves 1013. Additionally, for example, a second gas composition stored in the second gas source 1012 is admitted under pressure through the second gas control valve 1013B to the gas metering valve or valves 1013. Further, for example, the first gas composition or second gas composition, or both, of second gas supply 1015 can include a condensable inert gas, carrier gas or dilution gas. For example, the inert gas, carrier gas or dilution gas can include a noble gas, i.e., He, Ne, Ar, Kr, Xe, or Rn.

Furthermore, the first gas sources 111 and 1011, and the second gas sources 112 and 1012 are each utilized to produce ionized clusters. The material compositions of the first and second gas sources 111, 1011, 112, and 1012 include the principal atomic (or molecular) species, i.e., the first and second atomic constituents desired to be introduced for doping, depositing, modifying, or growing a layer.

The high pressure, condensable gas comprising the first gas composition and/or the second gas composition is introduced from the first gas supply 115 through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and a gas cluster beam emanates from nozzle 110.

Similarly, the high pressure, condensable gas comprising the first gas composition and/or the second gas composition is introduced from the second gas supply 1015 through gas feed tube 1014 into stagnation chamber 1016 and is ejected into the substantially lower pressure vacuum through a properly shaped nozzle 1010. As a result of the expansion of the high pressure, condensable gas from the stagnation chamber 1016 to the lower pressure region of the source chamber 104, the gas velocity accelerates to supersonic speeds and a gas cluster beam emanates from nozzle 1010.

Nozzles 110 and 1010 are mounted in such close proximity that the individual gas cluster beams generated by the nozzles 110, 1010 substantially coalesce in the vacuum environment of source chamber 104 into a single gas cluster beam 118 before reaching the gas skimmer 120. The chemical composition of the gas cluster beam 118 represents a mixture of compositions provided by the first and second gas supplies 115 and 1015, injected via nozzles 110 and 1010.

The inherent cooling of the jet as static enthalpy is exchanged for kinetic energy, which results from the expansion in the jets, causes a portion of the gas jets to condense and form a gas cluster beam 118 having clusters, each consisting of from several to several thousand weakly bound atoms or molecules. A gas skimmer 120, positioned downstream from the exit of nozzles 110 and 1010 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The first and second gas supplies 115 and 1015 can be configured to independently control stagnation pressures and temperatures of gas mixtures introduced to stagnation chambers 116 and 1016. Temperature control can be achieved by the use of suitable temperature control systems (e.g. heaters and/or coolers) in each gas supply (not shown). In addition, a manipulator 117 may be mechanically coupled to nozzle 110, for example via the stagnation chamber 116, the manipulator 117 being configured to position the coupled nozzle 110 with respect to the gas skimmer 120, independent of nozzle 1010. Likewise, a manipulator 1017 may be mechanically coupled to nozzle 1010, for example via the stagnation chamber 1016, the manipulator 1017 being configured to position the coupled nozzle 1010 with respect to the gas skimmer 120, independent of nozzle 110. Thus each nozzle in a multi-nozzle assembly may be separately manipulated for proper positioning vis-à-vis the single gas skimmer 120.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 1, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 1, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 1, the beam electronics 130 include an extraction power supply 138 that provides voltage $V_E$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{Acc}$ to bias one of the high voltage electrodes 126 with respect to the ionizer 122 so as to result in a total GCIB acceleration energy equal to about $V_{Acc}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{Acc}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter 146 may comprise a magnet assembly for imposing a magnetic field across the GCIB 128 to aid in the filtering process.

Referring still to FIG. 1, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 12A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 1, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a faraday cup or the like, closed except for a beam-entry opening, and is typically affixed to the wall of the vacuum vessel 102 with an electrically insulating mount 182.

As shown in FIG. 1, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 2:
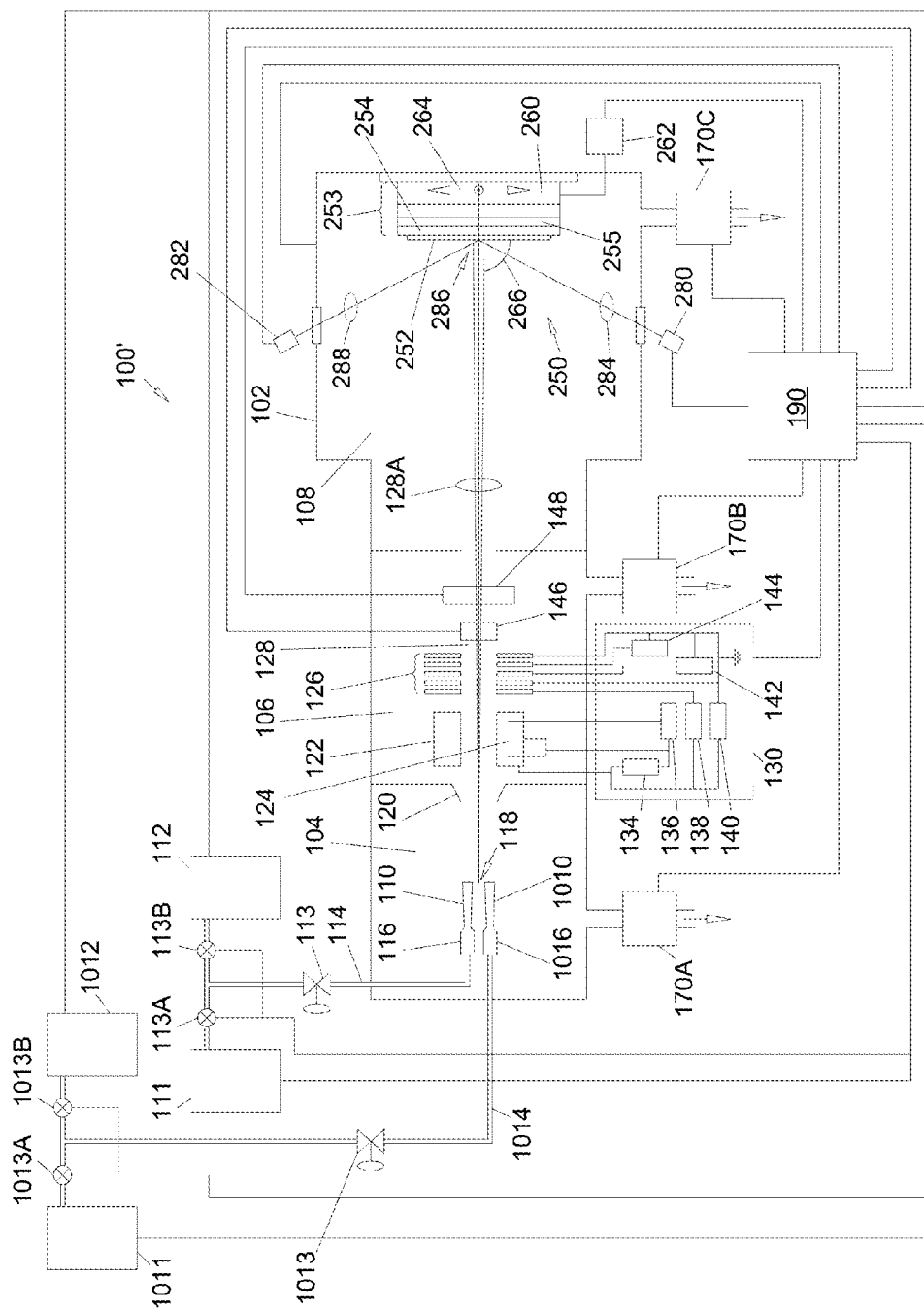
FIG. 2 is a schematic of a multiple nozzle GCIB system in accordance with another embodiment of the invention.

In the embodiment shown in FIG. 2, the GCIB processing system 100' can be similar to the embodiment of FIG. 1 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 1) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $_{VL1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 3:
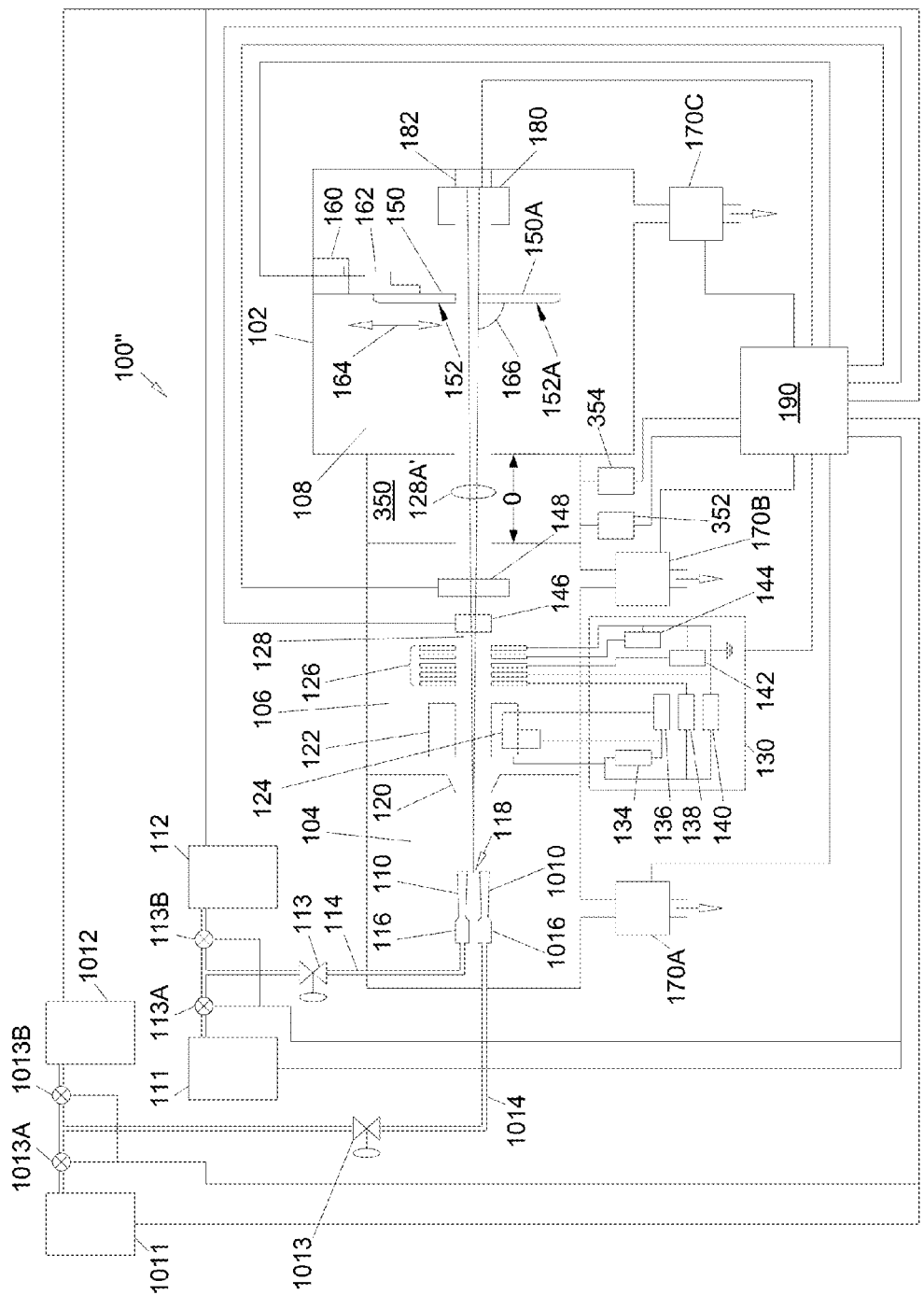
FIG. 3 is a schematic of a multiple nozzle GCIB system in accordance with yet another embodiment of the invention.

In the embodiment shown in FIG. 3, the GCIB processing system 100" can be similar to the embodiment of FIG. 1 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled METHOD AND APPARATUS FOR IMPROVED PROCESSING WITH A GAS-CLUSTER ION BEAM; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas sources 111 and 1011, second gas sources 112 and 1012, first gas control valves 113A and 1013A, second gas control valves 113B and 1013B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the internet. Furthermore, another computer (i.e., controller, server, etc.) can access control system 190 to exchange data via a direct connection, an intranet, and/or the internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Also shown in FIGS. 2 and 3 is an alternative embodiment for a nozzle manipulator. Rather than each nozzle 110, 1010 being coupled to a separately operable manipulator 117, 1017 as in FIG. 1, the nozzles 110, 1010 may be coupled to each other, and together coupled to a single manipulator 117A. The position of the nozzles 110, 1010 vis-à-vis the gas skimmer 120 can then be manipulated collectively as a set rather than individually.

Figure 4:
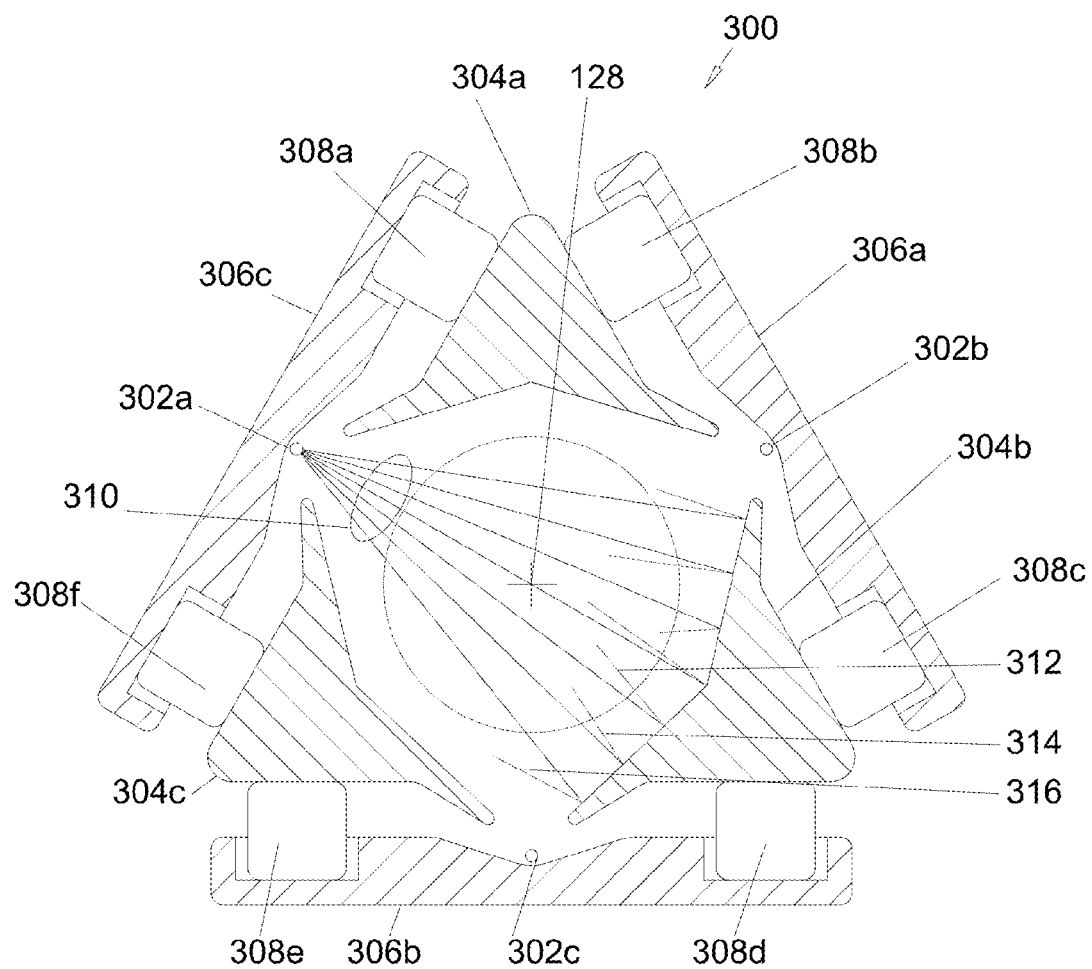
FIG. 4 is a schematic of an embodiment of an ionizer for use in a GCIB system.

Referring now to FIG. 4, a section 300 of a gas cluster ionizer (122, FIGS. 1, 2 and 3) for ionizing a gas cluster jet (gas cluster beam 118, FIGS. 1, 2 and 3) is shown. The section 300 is normal to the axis of GCIB 128. For typical gas cluster sizes (2000 to 15000 atoms), clusters leaving the gas skimmer aperture (120, FIGS. 1, 2 and 3) and entering an ionizer (122, FIGS. 1, 2 and 3) will travel with a kinetic energy of about 130 to 1000 electron volts (eV). At these low energies, any departure from space charge neutrality within the ionizer 122 will result in a rapid dispersion of the jet with a significant loss of beam current. FIG. 4 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Alternatively, ionizers may use electron extraction from plasma to ionize clusters. The geometry of these ionizers is quite different from the three filament ionizer described here but the principles of operation and the ionizer control are very similar. For example, the ionizer design may be similar to the ionizer described in U.S. Pat. No. 7,173,252, entitled IONIZER AND METHOD FOR GAS-CLUSTER ION-BEAM FORMATION; the content of which is incorporated herein by reference in its entirety.

The gas cluster ionizer (122, FIGS. 1, 2 and 3) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figure 5:
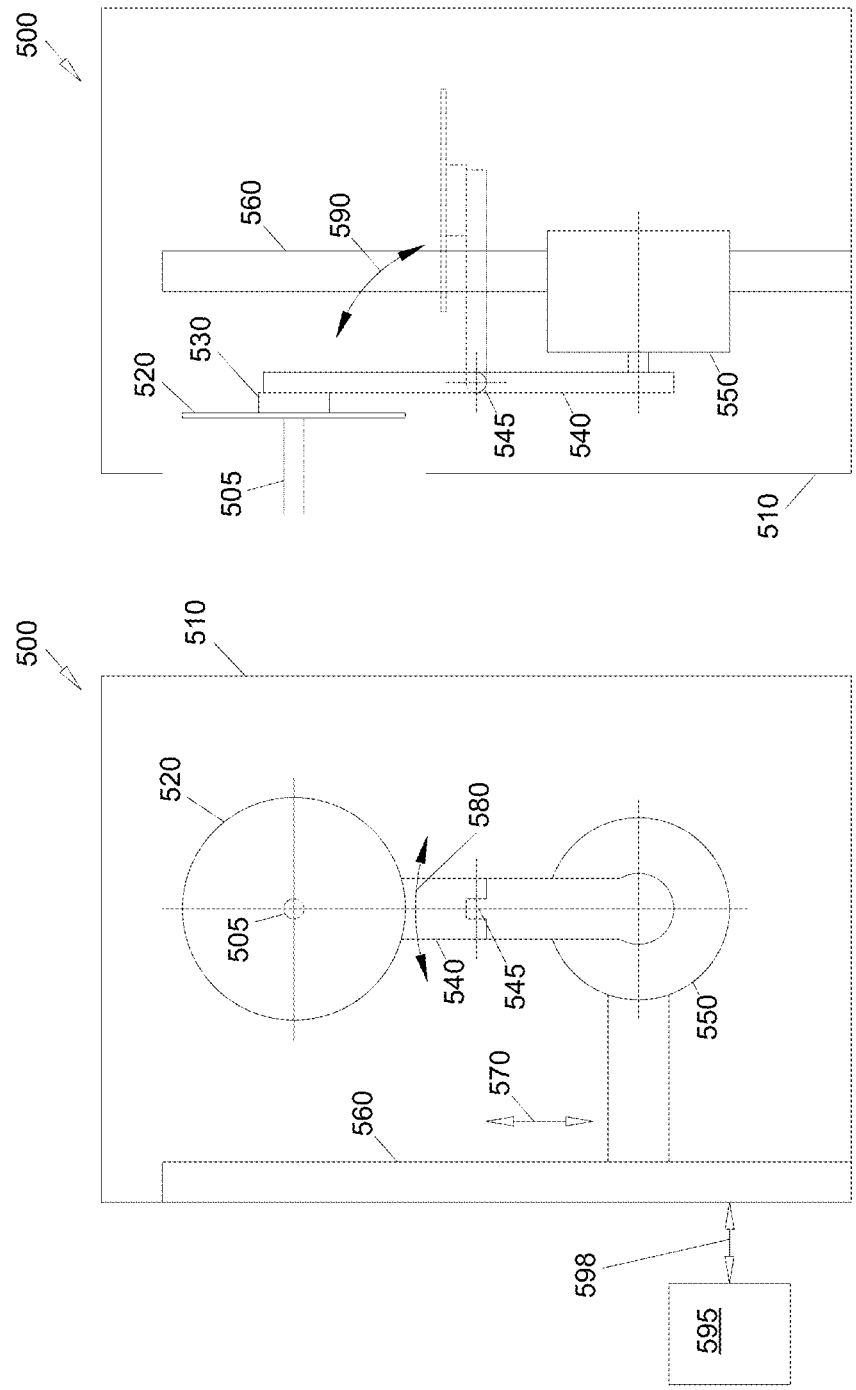
FIGS. 5A and 5B are schematics of an embodiment of a workpiece scanning mechanism for use in a GCIB system.

Referring now to FIGS. 5A and 5B, an embodiment of the workpiece scanning mechanism 500, is shown. The workpiece scanning mechanism 500 is enclosed in a processing chamber 510, which can be, for example, one of processing chambers 108, of processing systems 100, 100', or 100", of FIGS. 1, 2, and 3. The purpose of processing chamber 510 is to enclose the workpiece 520 in a low pressure environment, free of contamination, during irradiation thereof using the GCIB. The workpiece 520 is attached using a chuck 530 to a first end of scanning arm 540, which comprises an elongated member acting to scan the workpiece 520 in a arcuate path 580 across GCIB 505, which enters the processing chamber 510 from, for example, one of ionization/acceleration chambers 106, of processing systems 100, 100', or 100", of FIGS. 1, 2, and 3. Depending on the configuration, the chuck 530 can secure the workpiece 520 to the scanning arm 540 using mechanical clamping, vacuum suction, or using electrostatic clamping. An exemplary embodiment of an electrostatically-clamping chuck 530 is described in U.S. Pat. No. 7,948,734 entitled ELECTROSTATIC CHUCK POWER SUPPLY, and in U.S. patent application Ser. No. 12/749,999 entitled ELECTROSTATIC CHUCK POWER SUPPLY, both incorporated herein by reference in their entirety.

The second end (i.e. point of rotation) of the scanning arm 540, away from workpiece 520 and chuck 530, is attached to the rotary output shaft of the fast-scan motor 550, which acts as a rotational mechanism to actuate the workpiece 520 in the fast-scan movement direction, along arcuate path 580. An exemplary embodiment of a fast-scan motor 550 is described in U.S. Pat. No. 7,608,843 entitled METHOD AND APPARATUS FOR SCANNING A WORKPIECE THROUGH AN ION BEAM, also herein incorporated by reference in its entirety. The fast-scan motor 550 is itself supported by the slow-scan mechanism 560, to be described in greater detail later. The slow-scan mechanism 560 is configured to move the fast-scan motor 550, scanning arm 540, chuck 530, and workpiece 520 in the slow-scan movement direction 570, along a linear path.

While the embodiment of FIGS. 5A and 5B shows the slow-scan mechanism 560 aligned in the vertical direction, and thus the scanning arm 540 acts as an inverted pendulum, the slow-scan mechanism 560 can also be installed in a horizontal direction, or at some angle between horizontal and vertical, while still allowing the GCIB 505 to reach all points of workpiece 520. For example, in one embodiment, the slow-scan mechanism 560 may be mounted horizontally along the bottom wall of processing chamber 510. In another exemplary embodiment, the slow-scan mechanism 560 may be mounted horizontally along the upper wall of processing chamber 510.

To facilitate loading and unloading of workpieces, in one embodiment, the scanning arm 540 may include an optional joint 545, to allow the scanning arm 540 to bend sufficiently backwards, in a bending movement 590, such that the workpiece 520 can be loaded and unloaded from chuck 530 in a horizontal position, as shown in FIG. 5B. Joint 545 can be actuated using a motor (not shown), and an embodiment of a joint actuation system is described in U.S. Pat. No. 7,608,843 entitled METHOD AND APPARATUS FOR SCANNING A WORKPIECE THROUGH AN ION BEAM, herein incorporated by reference in its entirety.

A controller 595, communicating via communication lines 598, is used to control the workpiece scanning mechanism 500. Controller 595 may be implemented as a separate controller, or it can be implemented as a part of control system 190, of processing systems 100, 100', or 100", of FIGS. 1, 2, and 3. Controller 595 comprises a microprocessor, memory, and a digital I/O port capable of generating control voltages sufficient to communicate and activate inputs to workpiece scanning mechanism 500. Moreover, controller 595 can be coupled to and can exchange information with fast-scan motor 550, slow-scan mechanism 560, chuck 530, joint 545, etc. For example, a program stored in the memory can be utilized to activate the inputs to the aforementioned components of the workpiece scanning mechanism 500 according to a process recipe in order to perform a GCIB process on workpiece 520. Controller 595 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

Figure 6:
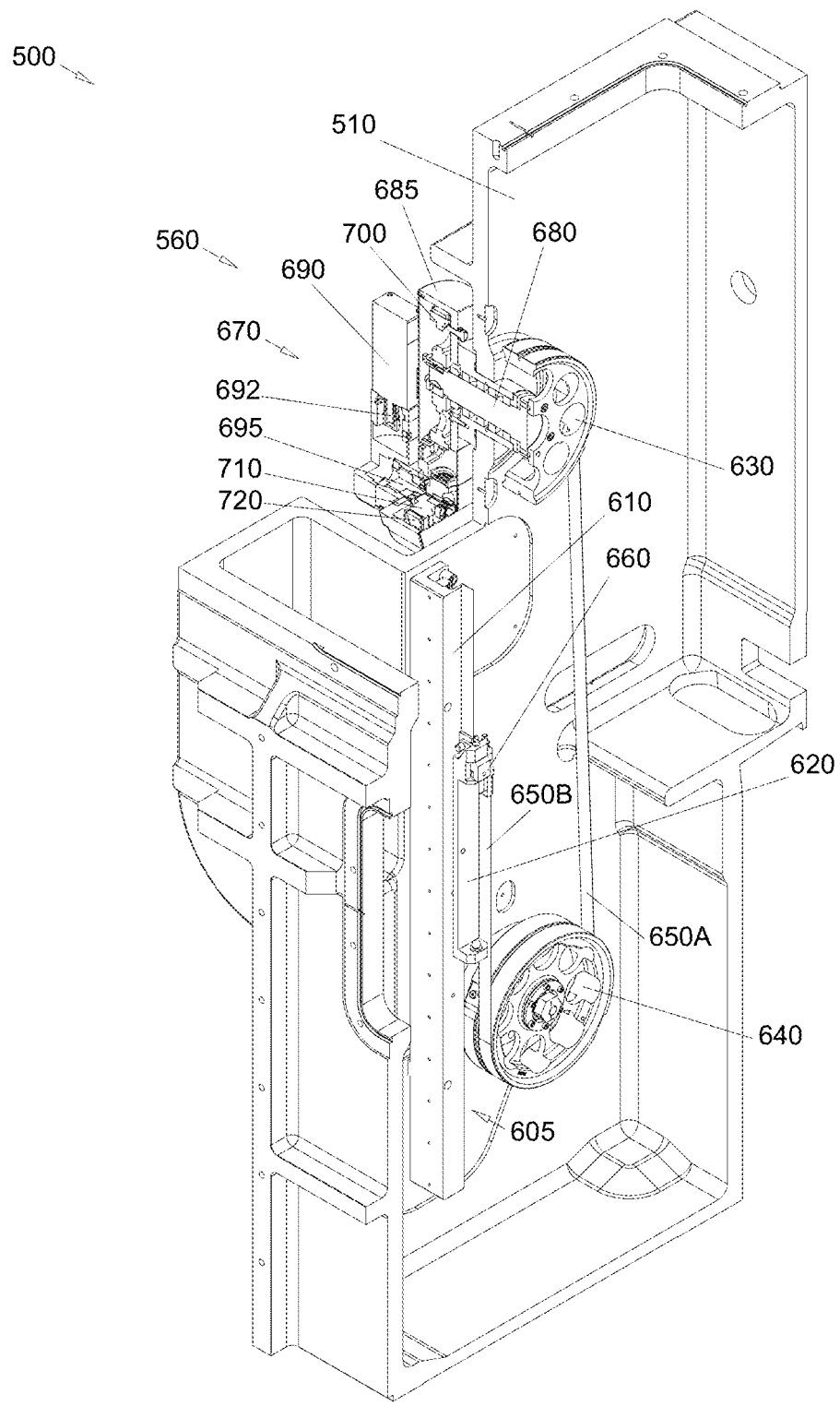
FIG. 6 is a detailed and partial cut-away schematic of a slow-scan mechanism in accordance with an embodiment of the invention.
Figure 7:
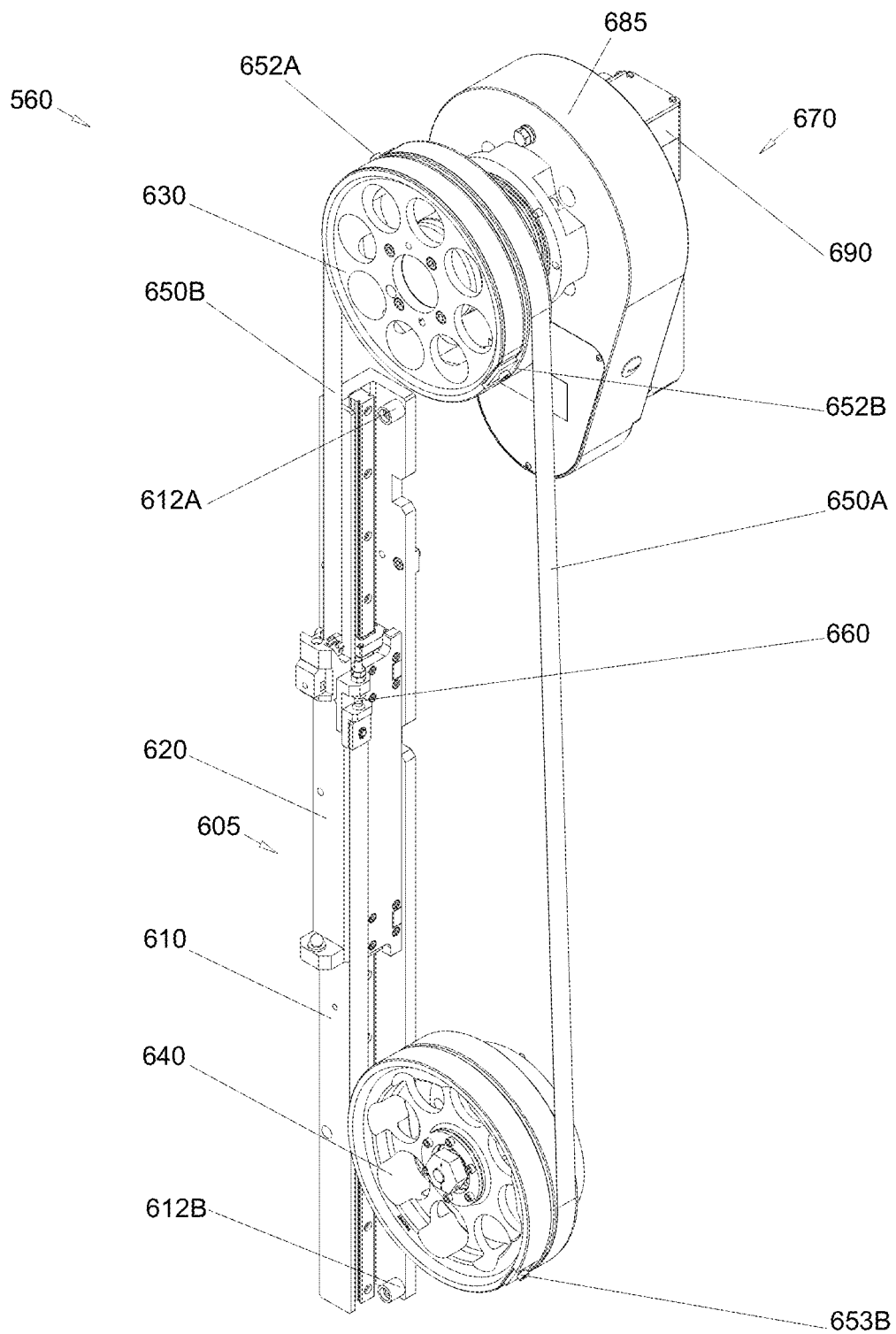
FIG. 7 is a detailed schematic of a slow-scan mechanism in accordance with an embodiment of the invention.

FIGS. 6 and 7 show an exemplary embodiment of slow-scan mechanism 560 of workpiece scanning mechanism 500. The exemplary embodiment of FIGS. 6 and 7 is shown installed such that the slow-scan movement is in the vertical direction, but as was mentioned earlier, other installation angles may be used. FIG. 6 shows partial cutaway views of the assembly, but with the surrounding structure, such as processing chamber 510. FIG. 7 shows a view without the surrounding structures.

At the core of slow-scan mechanism 560 is a shuttle drive assembly 605, comprising a rail 610 and shuttle 620. The shuttle 620 has an attachment point 660, to which the fast-scan motor 550 can be attached, the rail 610 allowing the shuttle 620 (and all structures attached thereto, i.e. fast-scan motor 550, scanning arm 540, chuck 530, and workpiece 520) to freely move along a linear path defining the slow-scan movement direction 570. At the ends of rail 610, stops 612A and 612B are attached to prevent the shuttle 620 from slipping off the rail 610.

Generally parallel to the shuttle drive assembly are installed pulleys 630 and 640, over which belt 650A,B is mounted. The belt 650A,B comprises a full loop, and can be a flat belt or a geared belt. The belt 650A,B is made of a material compatible with the GCIB process, so as to reduce outgassing and contamination, and can be made of a metal or polymeric material. In one embodiment, the belt 650A,B can be made of a single strand or loop of material (not shown). In another embodiment, the belt 650A,B can be made of two portions 650A and 650B, each independently attached to pulleys 630 and 640 respectively, at attachment points 652A, 652B, 653B, etc. In this latter embodiment, each pulley 630 and 640 comprises two side-by-side pulleys, attached together or integrally-machined. Also, in this latter embodiment, the diameters of the pulleys 630 and 640 are chosen large such that the angular travel of pulleys 630 and 640 allows the full range of slow-scan motion of shuttle 620, without the belt portions 650A and 650B separating from their respective attachment points 652A, 652B, 653B, etc.

One portion of belt 650A,B, 650B, is attached to the shuttle 620, proximate the attachment point 660, to facilitate actuation of the shuttle 620 in the slow-scan movement direction 570. In an embodiment, belt 650A,B can be a geared belt, in which case sprockets 630 and 640 are used in lieu of pulleys 630 and 640.

Figure 8:
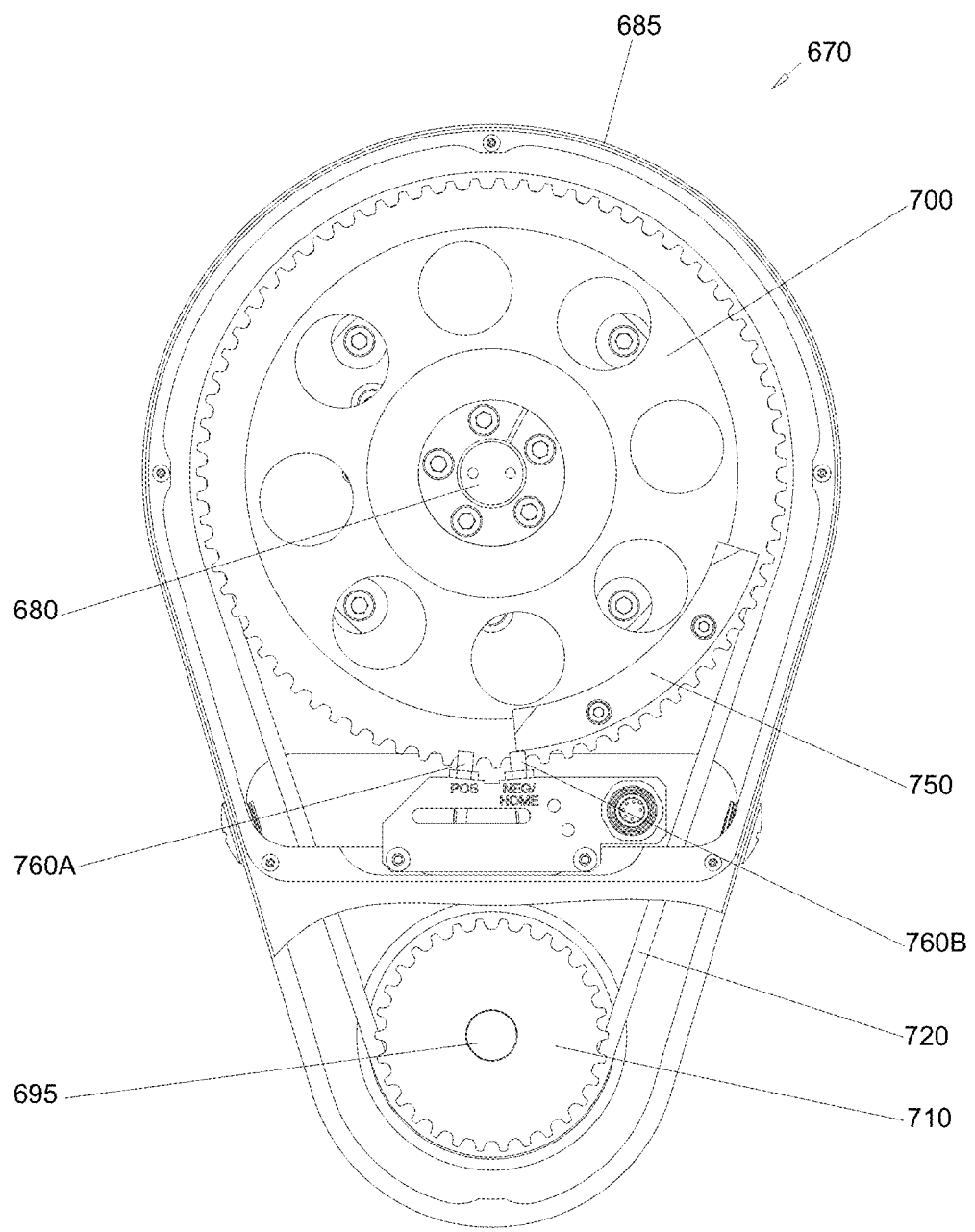
FIG. 8 is a detailed schematic of a portion of a drive mechanism for a slow-scan mechanism in accordance with an embodiment of the invention.

Still with reference to FIGS. 5A, 5B, 6, and 7, to actuate the belt 650A,B and thus effect a slow-scan movement of fast-scan motor 550, scanning arm 540, chuck 530, and workpiece 520, a drive mechanism 670 is provided. Drive mechanism 670 can be attached to any of pulleys 630, 640; and FIGS. 7 and 8 depict it attached to pulley 630 mounted in the upper position along shuttle drive assembly 605. The drive mechanism 670 comprises a vacuum rotary feedthrough 680, mounted on the wall of processing chamber 510, to which vacuum rotary feedthrough the pulley 630 is attached. The vacuum rotary feedthrough 680 allows rotating motion to be imparted on pulley 630, from a servo motor 690 external to the processing chamber 510, without breaching the vacuum maintained within processing chamber 510. Between the vacuum rotary feedthrough 680 and servo motor 690, an optional reducing transmission 685 may be installed. In one embodiment, reducing transmission 685 may comprise a pair of sprockets 700 and 710, over which a geared belt 720 is mounted. Alternatively, the reducing transmission 685 may comprise a pair of pulleys 700 and 710 over which a flat belt 720 is mounted. In yet another alternative embodiment, the reducing transmission 685 may comprise a reduction gear set, for example, instead of a belt drive. The purpose of the reducing transmission 685 is to at least in part reduce the rpms of the servo motor 690 to a level required for safe operation of slow-scan mechanism 560. Additional reduction of rpms of servo motor 690 can be achieved using an optional reduction gear set 692, which may or may not be a part of servo motor 690 itself.

To operate the slow-scan mechanism 560 of the workpiece scanning mechanism 500, servo motor 690 is actuated based on control signals from controller 595. In an embodiment, rotary motion from the servo motor 690 is transmitted via sprockets 700 and 710, and geared belt 720, to the vacuum rotary feedthrough 680. The vacuum rotary feedthrough provides the rotary motion to pulley 630, which actuates the belt 650A,B to initiate movement of shuttle 620, attached thereto. Lastly, pulled by belt 650A,B, the shuttle 620 slides along the linear path defined by rail 610 of shuttle drive assembly 605, guiding the fast-scan motor 550, scanning arm 540, chuck 530, and workpiece 520, attached thereto.

FIG. 8 shows an exemplary embodiment of reducing transmission 685, utilizing a pair of sprockets 700 and 710, and a geared belt 720. The larger sprocket 700 is attached to one end of vacuum rotary feedthrough 680. The smaller sprocket 710 is attached to the drive shaft of servo motor 695. It has been mentioned before that the rotary range of motion of sprocket 700, vacuum rotary feedthrough 680, and pulley 630, needs to be limited to prevent overtravel of belt 650A,B, which may cause separation of portions 650A and 651B of belt 650A,B, from pulleys 630 and 640. To prevent this, a set of limit switches 760A and 760B is installed in the reducing transmission 685, which feed signals to controller 595, to cut out power to servo motor 690 when at the extreme ends of the allowed rotary range of travel of sprocket 700, vacuum rotary feedthrough 680, and pulley 630. A suitably-sized limit switch strike 750 is used to trigger the state of limit switches 760A and 760B at the extreme ends of the allowed rotary range of travel of sprocket 700, vacuum rotary feedthrough 680, and pulley 630.

Advantages of the design of reducing transmission 685, over, for example, a worm gear set described in U.S. Pat. No. 7,608,843 entitled METHOD AND APPARATUS FOR SCANNING A WORKPIECE THROUGH AN ION BEAM (herein incorporated by reference in its entirety), include simplicity, lower cost, and higher resilience to shock arising from varying friction of the shuttle 620 along rail 610, of shuttle drive assembly 605. Along with the use of two pulleys 630 and 640, and a belt 650A,B mounted thereon, the present invention mitigates many of the failure modes of the workpiece scanning mechanism described in U.S. Pat. No. 7,608,843, and discussed before. To replace the natural action of a worm gear pair as a "brake", i.e. in which a sudden increase in the torque load is prevented from being transmitted to a servo motor driving the worm gear, in an embodiment, the servo motor 690 of the present invention can be equipped with a brake.

Figures 9A, 9B:
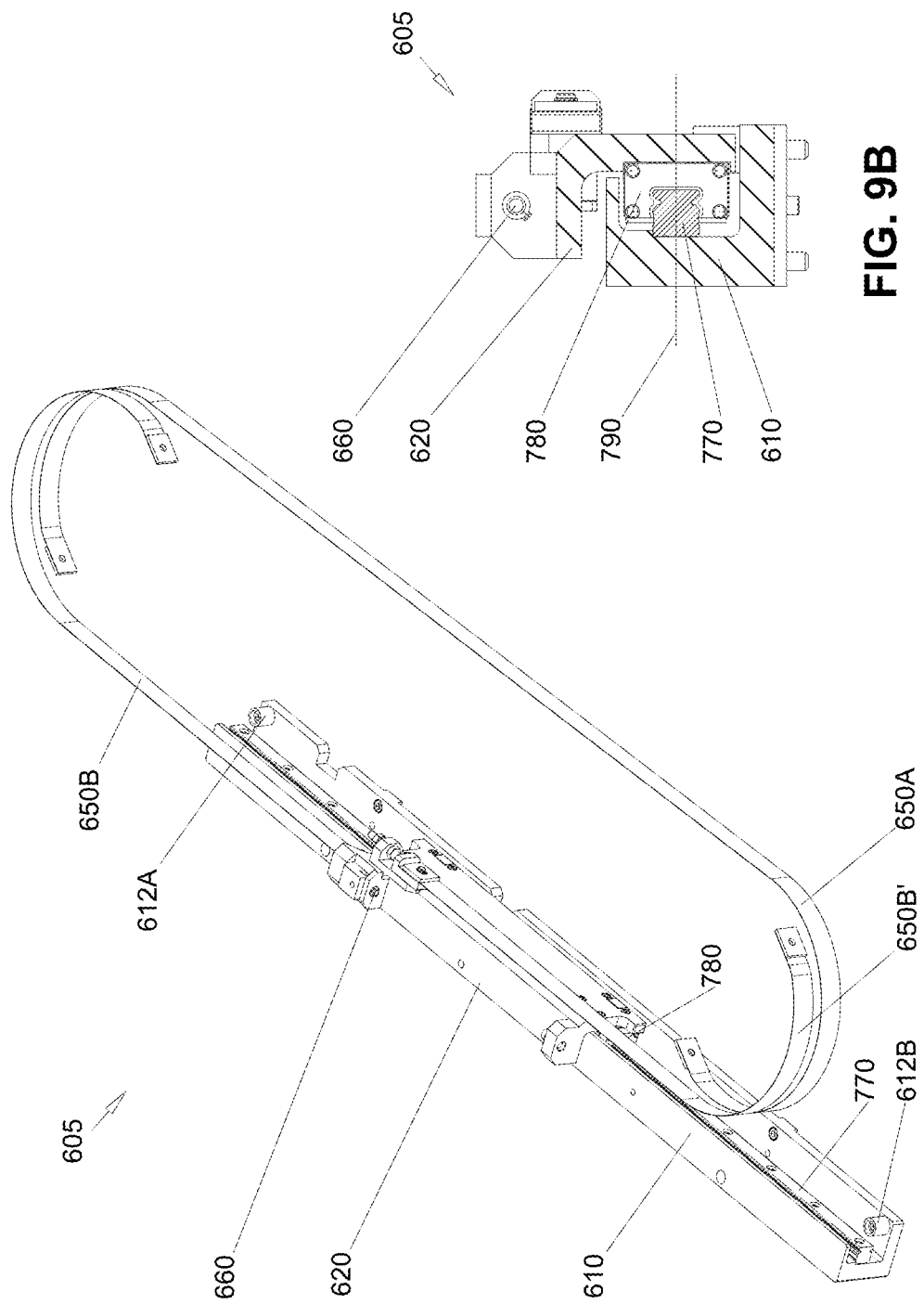
FIGS. 9A and 9B are detailed schematics of a shuttle drive assembly in accordance with an embodiment of the invention.

FIGS. 9A and 9B show an embodiment of a shuttle drive assembly 605. Referring to FIG. 9B, the shuttle drive assembly 605 comprises a rail 610, the rail 610 including a guide 770 installed thereupon. A slider 780 is allowed to slide along guide 770, to which are attached the shuttle 620 and attachment point 660 for attachment of fast-scan motor 550. The guide 770 and slider 780 define a longitudinal plane of symmetry 790 of the shuttle drive assembly 605, and in the present embodiment the shuttle 620 and attachment point 660 are all located outside of the longitudinal plane of symmetry 790. This asymmetric configuration has a number of advantages over prior art symmetrical shuttle drive assemblies, including being less prone to failure due to contamination from a GCIB, because as can be seen in FIG. 5A, 5B, and 6, for example, the shuttle drive assembly 605 of FIGS. 9A and 9B can be installed such that the opening exposing the guide 770 and slider 780 is oriented away from the direction in which the GCIB 505 enters processing chamber 510, thereby reducing failure rate due to contamination and jamming.

In one embodiment, any one or combination of these parameters are utilized to form a GCIB in a GCIB processing system having a beam profile that substantially approximates a Gaussian profile as illustrated in FIG. 7. In other embodiments, other beam profiles are possible.

Figure 10:
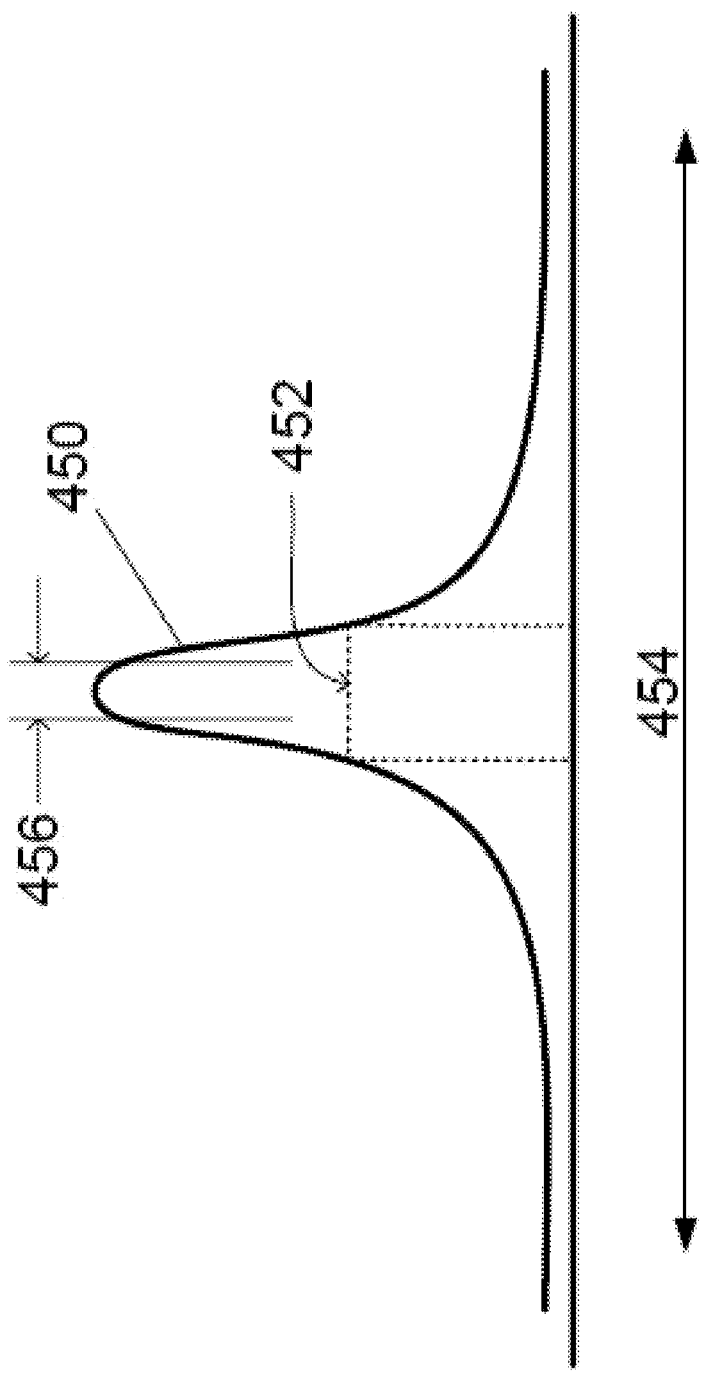
FIG. 10 illustrates an exemplary profile of beam intensity across a GCIB

As shown in FIG. 10, a beam profile 450 having a substantially Gaussian profile is formed. At an axial location along the length of the GCIB (e.g., the substrate surface), the beam profile is characterized by a full width at half maximum (FWHM) 452 and a maximum width 454 (e.g., full width at 5% the peak intensity).

After establishing the GCIB, flow proceeds to 520, where metrology data is acquired for a substrate. The metrology data can include parametric data, such as geometrical, mechanical, electrical and/or optical parameters associated with the upper layer or one or more devices formed in or on the upper layer of the substrate. For example, metrology data includes, but is not limited to, any parameter measurable by the metrology systems described above. Additionally, for example, metrology data includes measurements for a film thickness, a film height, a surface roughness, a surface contamination, a feature depth, a trench depth, a via depth, a feature width, a trench width, a via width, a critical dimension (CD), an electrical resistance, or any combination of two or more thereof. Furthermore, for example, metrology data can include one or more measurable parameters for one or more surface acoustic wave (SAW) devices, such as a SAW frequency.

The shaping aperture can be characterized by a cross-sectional dimension. The cross-sectional dimension may include a diameter or a width. Additionally, the shape of the one or more shaping apertures can include a circle, an ellipse, a square, a rectangle, a triangle, or a cross-section having any arbitrary shape. Referring again to FIG. 10, a GCIB can be formed having the beam profile 450, which substantially approximates a Gaussian profile. As an example, the cross-sectional dimension 456 of the aperture is selected to comprise a diameter less than or equal to the FWHM of the GCIB.

Figure 11:
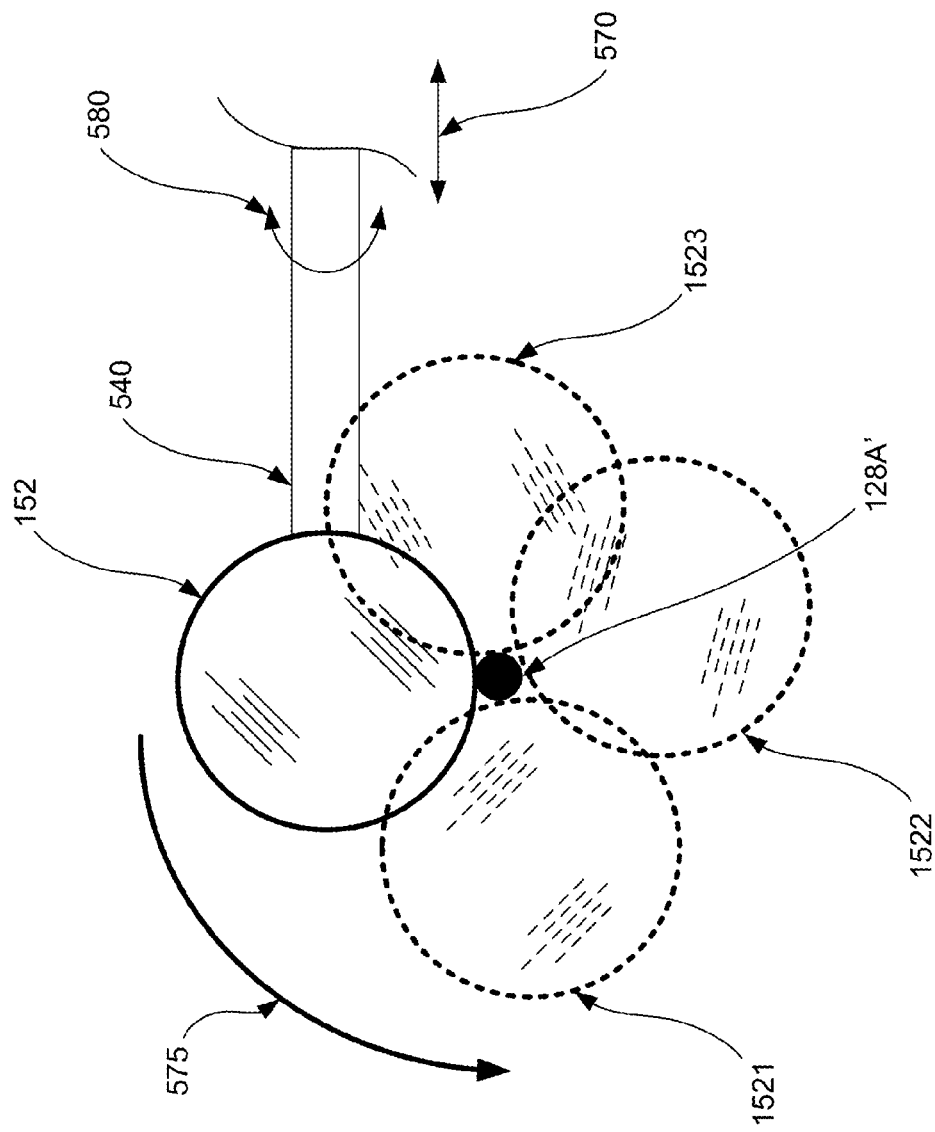
FIG. 11 illustrates an exemplary circular scan of a substrate around a GCIB.

FIG. 11 illustrates an exemplary circular scan of a substrate 152 around a GCIB 128A' that at least partially makes contact with the substrate along a circular path. Hence, the GCIB 128A' may etch or deposit a film around the periphery of the substrate 152. This may be done to compensate for substrate 152 edge profiles that have a higher or lower thickness than the interior area of the substrate 152. For example, if the substrate's 152 edge thickness deviates from the rest of the substrate, the circular scan of the substrate 152 by the GCIB 128A' may etch a film to minimize the thickness deviation. Accordingly, the workpiece scanning mechanism 500, as shown in FIG. 5A-5B, may be programmed or configured to enable the etching or deposition around the periphery of the substrate 152.

In FIG. 11, the substrate 152 may be enabled to move in the rotational motion by using the workpiece scanning mechanism 500, as shown in FIGS. 5A and 5B. Only the scanning arm 540 of workpiece scanning mechanism 500 is shown in FIG. 11 for the purposes of ease of illustration and explanation. In one embodiment, the circular scanning may enable the GCIB 128A' to make contact along the periphery of the substrate to etch the substrate or an overlying film as the substrate 152 makes rotational motions around the GCIB 128A'. For example, the substrate 152 may be coupled to the workpiece scanning mechanism 500 via the scanning arm 540 as described above in the description of FIGS. 5A-5B. The workpiece scanning mechanism 500 can move in rotational direction 580 between two points while also moving in a linear motion 570. The combination of the rotational 580 or radial motion and the linear motion 570 enables a circular motion 575 that allows the GCIB 128A' to scan across the edge of the substrate 152 in a rotational scan. As shown in FIG. 11, the scanning of the substrate 152 may start at one point near or at the edge of the substrate 152. The workpiece scanning mechanism 500 may move the substrate in a rotational motion 575 so that the GCIB 128A' traces a circular path around the substrate 152. For example, the movement of the substrate 152 around the GICIB 128A' is illustrated by the positions of the rotated substrates 1521, 1522, 1523 that show how the circular scan may be completed. Only four rotated substrates 1521, 1522, 1523 as shown in FIG. 11 for the purposes of ease of illustration and explanation. In practice, the GCIB 128A' makes more contact with the substrate 152 at more than the four points illustrated by the substrate 152 and the rotated substrates 1521, 1522, 1523. For example, the GCIB 128A' may make contact with the substrate 152 along circular path that may start and end at the same point on the substrate 152. After completing the first circular scan the workpiece scanning mechanism 500 may index the substrate to increase or decrease the circular scan radius (not shown) and begin another circular scan to etch or deposit along another circular path around the substrate 152. The scanning radius indexing may continue as desired to etch or deposit on the substrate where the GCIB 128A' intercepts the substrate 152. In this way, the edge thickness profile of the substrate 152 may be optimized without changing or substantially altering the thickness profile of the remainder of the substrate 152.

Figure 12:
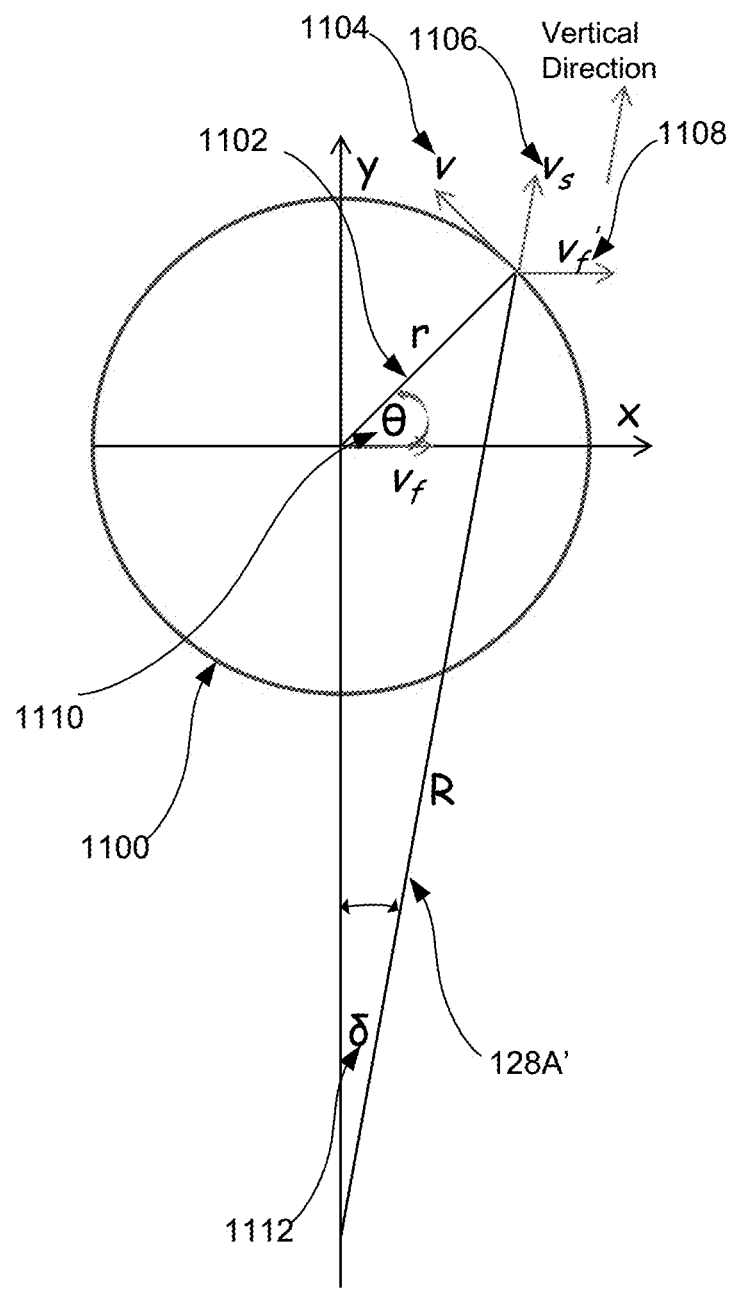
FIG. 12 illustrates a diagram of the angular, distance, and velocity relationships between the substrate and the GCIB during the circular scan.

FIG. 12 illustrates a diagram of the angular, distance, and velocity relationships between the substrate 152 and the GCIB 128A' during the circular scan. The velocity and direction of the circular scan may be controlled a first scanning motion 580 (radial) that oscillates between two points in a rotational motion and a second scanning motion 570 (linear) that when combined form a circular path 575 around the substrate 152.

In one embodiment, the circular scan 1100 may be implemented by knowing the scan radius 1102 from the center of the substrate 152, angle θ 1110, and the relative position of the GCIB 128A' via the angle delta δ 1112 which may represent the angle between the GCIB 128A' and the center of the substrate 152. In one embodiment, the substrate radius may be at least 150 mm. The velocity 1104 or dwell time of the circular scan may be optimized by controlling a velocity of the first scanning motion 1106 and a velocity of the second scanning motion 1108. The velocity 1104 may be constant and may be used to derive the velocity of the first scanning motion 1106 and a velocity of the second scanning motion 1108, as shown in FIG. 12. For example, the first scanning motion velocity 1106 may be derived from the following equation:

$$V_S = v \frac{\cos\theta}{\cos\delta}$$

The second scanning motion velocity 1108 may be derived from the following equation:

$$V_f = v \cos\theta - v_s \cos\delta$$

In one embodiment, the velocity 1104 may be constant during the scan process to maintain a similar dwell time around the substrate. However, to account for variations in the thickness profile (not shown) the characteristics of the GCIB 128A' may be varied to increase or decrease the localized etch or deposition rate within the same circular scan. Likewise, the etch or deposition rate may be varied by changing the velocity 1104 during a circular scan. In this way, the dwell time of the GCIB 128A' may be optimized to account for thickness variations that may exist along the circular scan pattern implemented by the workpiece scanning mechanism 500.

Figure 13:
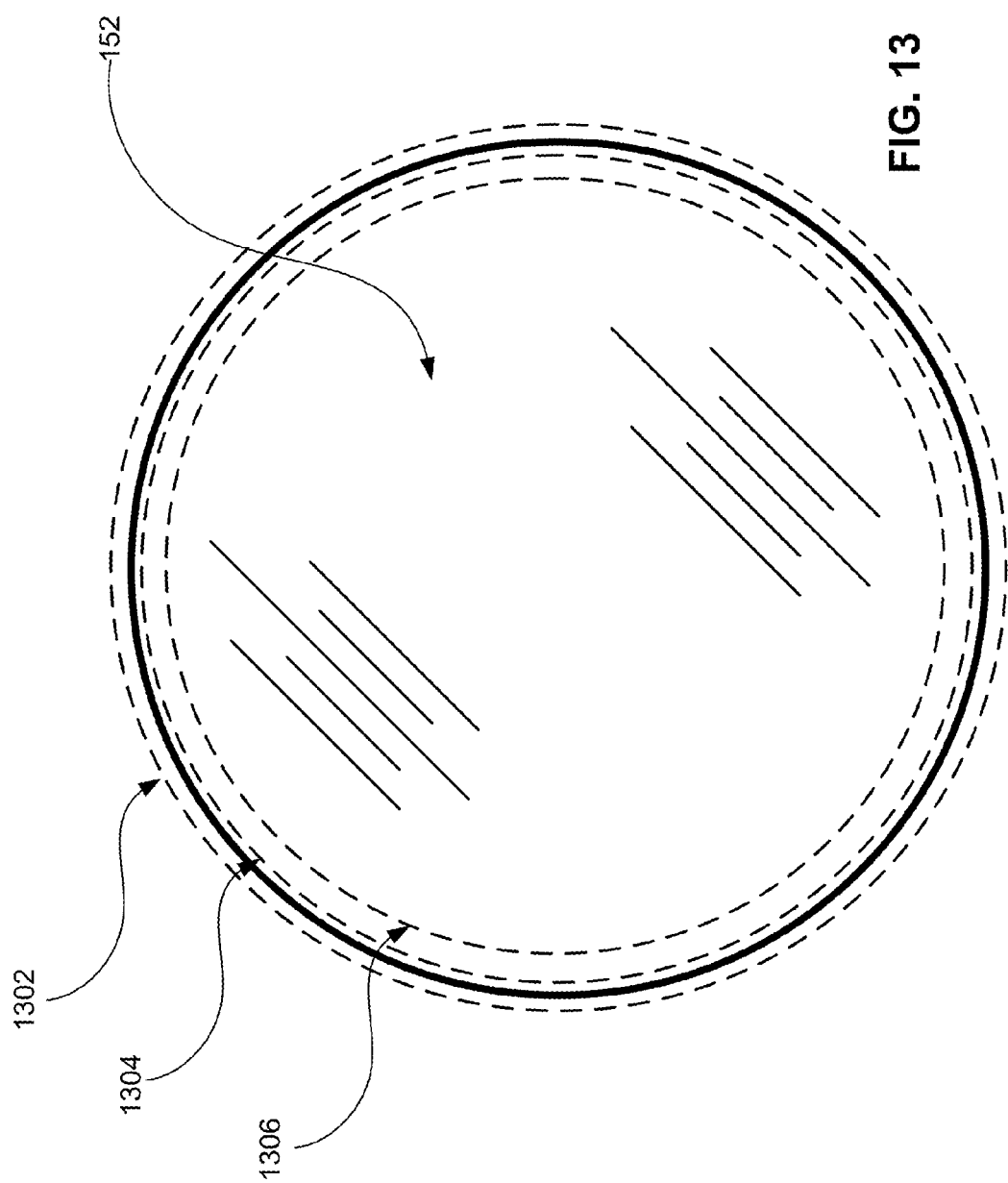
FIG. 13 illustrates an example of a starting radius and an ending radius for the circular scan.

FIG. 13 illustrates a substrate 152 that shows the paths of circular scans that may be made during etch or deposition processes in the GCIB processing system 100. For ease of illustration and explanation, only three circular scan paths are shown in FIG. 13. The first radius 1302 may be a starting or ending radius located at or near the edge of the substrate 152. In some embodiments, the first radius 1302 may be slightly larger than the substrate's 152 radius to account for the profile and/or intensity of the GCIB 128A'. In some instances, the beam profile may be relatively large and may impact a larger area than other profiles. Hence, the entire GCIB 128A' beam profile may not have to be in complete contact with the substrate during the first radius 1302 scan. In some embodiments, the entire GCIB 128A' beam profile may not contact the substrate in its entirety for more than one circular scan

1100. However, in other embodiments, the first radius 1302 may be less the substrate's 152 radius.

The second radius 1304 scan may be performed after the first radius 1302 scan. The second radius 1304 may be smaller than the first radius 1302, as shown in FIG. 13. However, this is not necessarily required in other embodiments. Generally, the second radius scan 1304 is representative of many other circular scans that may be made during etch or deposition processes. For example, one process may include two or more circular scans that vary in radius between the first radius 1302 and the third radius 1306. The third radius 1306 may be a starting radius or an ending radius. The third radius 1306 may be a shorter distance, as measured from the center of the substrate 152, than the first radius 1302 and the second radius 1304. The number and radius of scans may be based, at least in part, on the thickness profile of the substrate 152 and/or the characteristics of the GCIB 128'. In some embodiments, the circular scans may oscillate between the first radius 1302 and the third radius 1306 or second radius 1304. For example, the first radius 1302 may be the starting radius and the ending radius for the GCIB scanning that may move between the first radius 1302 and the third radius 1306. The starting and ending radius may vary accordingly to the thickness profile at the edge of the substrate 152.

FIG. 14A illustrates a simplified exemplary embodiment of implementing the circular scan (e.g., first radius scan 1302) on the substrate 152 by GCIB processing system 100. FIG. 14A shows a cross section of the substrate 152 and the thickness profile 1400 of any overlying film. In this embodiment, the GCIB 128A' shown at a starting radius that is larger than the substrate's 152 radius. However, the beam profile of the GCIB 128A's may still impact the thickness profile even when the starting radius may be larger than the substrate's radius 152. The starting radius and the substrate's 152 radius may be measured from the centerline 1402 of the substrate 152.

The circular scan 1100 may be completed by rotating 1404 the substrate 152 in a rotational movement between a starting point (not shown) and an ending point (not shown) that may be the same location. As shown in FIG. 14A, the substrate 152 may be indexed towards the GCIB 128A' for another circular scan that covers another portion of the substrate 152. Based on the beam profile of the GCIB 128', the impact of two or more scans may overlap the same or similar portions of the substrate 152 or the overlying film.

FIG. 14B illustrates an exemplary result of using the circular scan on the thickness profile 1400 of the substrate 152. In this embodiment, portions 1406 of the underlying film may be etched away to minimize variation of the thickness profile 1400. Accordingly, the previous non-uniformity (e.g., thickness profile 1400) of the substrate 152 may not impact or have lower impact on additional processing (e.g., etch, pattern, deposition . . . etc.) of the substrate 152. For example, additional processing may include, but is not limited to, etching the overlying film across the entire substrate 152.

Figure 15:
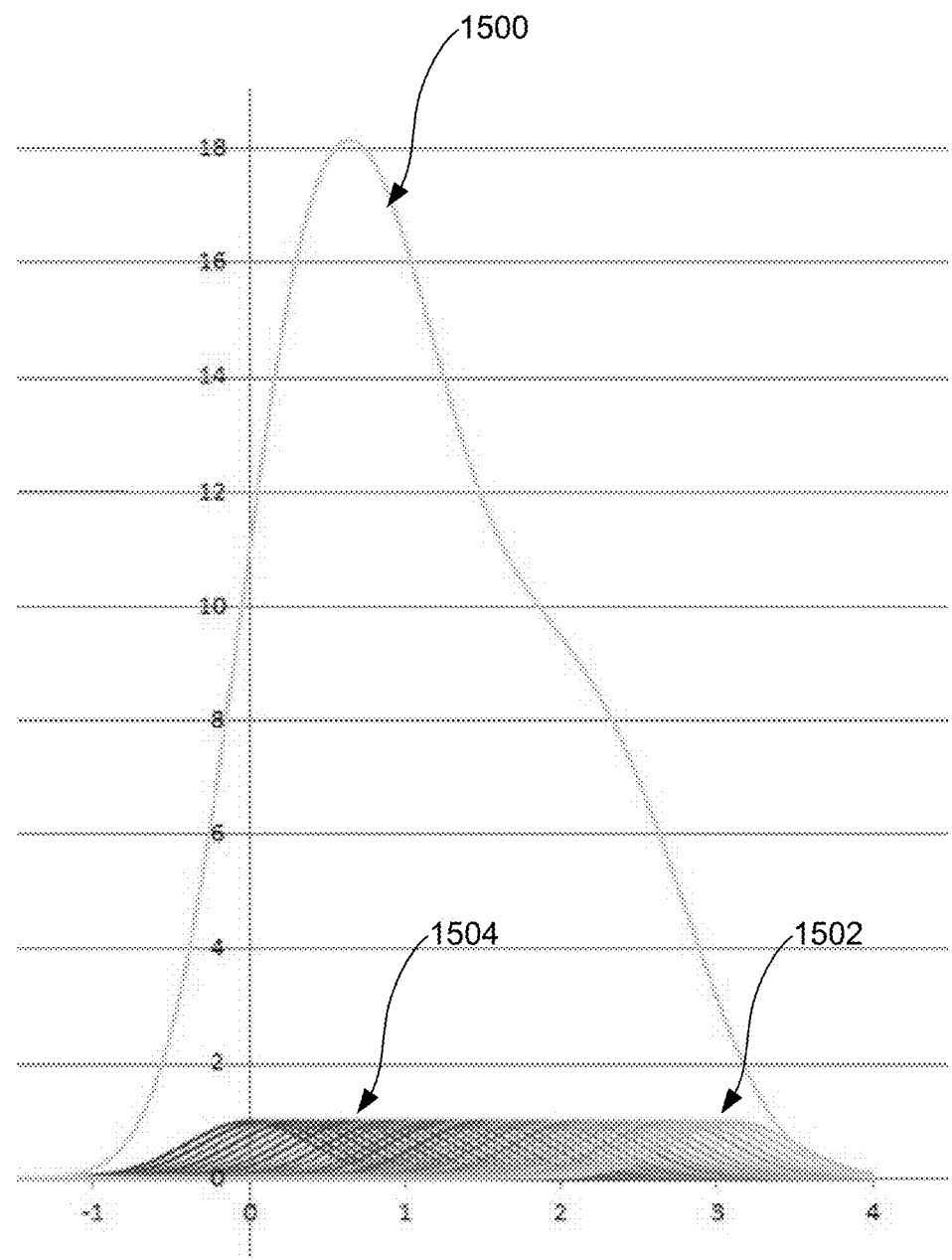
FIG. 15 illustrates a GCIB energy distribution over the substrate region between the starting radius and the ending radius.

FIG. 15 illustrates a GCIB energy distribution 1500 over the substrate 152 region between the starting radius 1302 and the ending radius 1306. In this embodiment, the scan density 1504 near the edge of the substrate 152 is higher than the scan density 1502 that is closer to the center of the substrate 152. The scan density is made up of beam profiles for the GCIB 128A' and their relative location to each other and the substrate 152 during the circular scans. For example, each circular scan may be represented by at least one of the beam profile curves. The scan density plot shows that the highest scan density occurred around 1 mm from the edge (e.g., zero on the x-axis) of the substrate 152. The integration of all the beam profiles may be used to generate the GCIB energy distribution 1500 across the substrate. In this embodiment, the etch process was limited to circular region that extended from the edge of the substrate to 4 mm from the edge. However, in other embodiments, the process region may reach up to 10 mm or more from the edge of the substrate 152.

In one embodiment, the GCIB energy distribution 1500 may correspond to the thickness profile of the substrate 152, in that high density areas 1504 may correspond to higher thicknesses of the substrate 152 or the overlying film. In this embodiment, the higher density area 1504 may be formed by decreasing the distance between circular scans. In another embodiment (not shown), the high energy area 1500 may be formed by decreasing the velocity of the substrate to increase the dwell time of the GCIB 128A' over particular portions of the substrate 152. In another embodiment, the high energy area 1500 may also be formed by increasing the energy or other characteristics of the GCIB 128A'.

Figure 16:
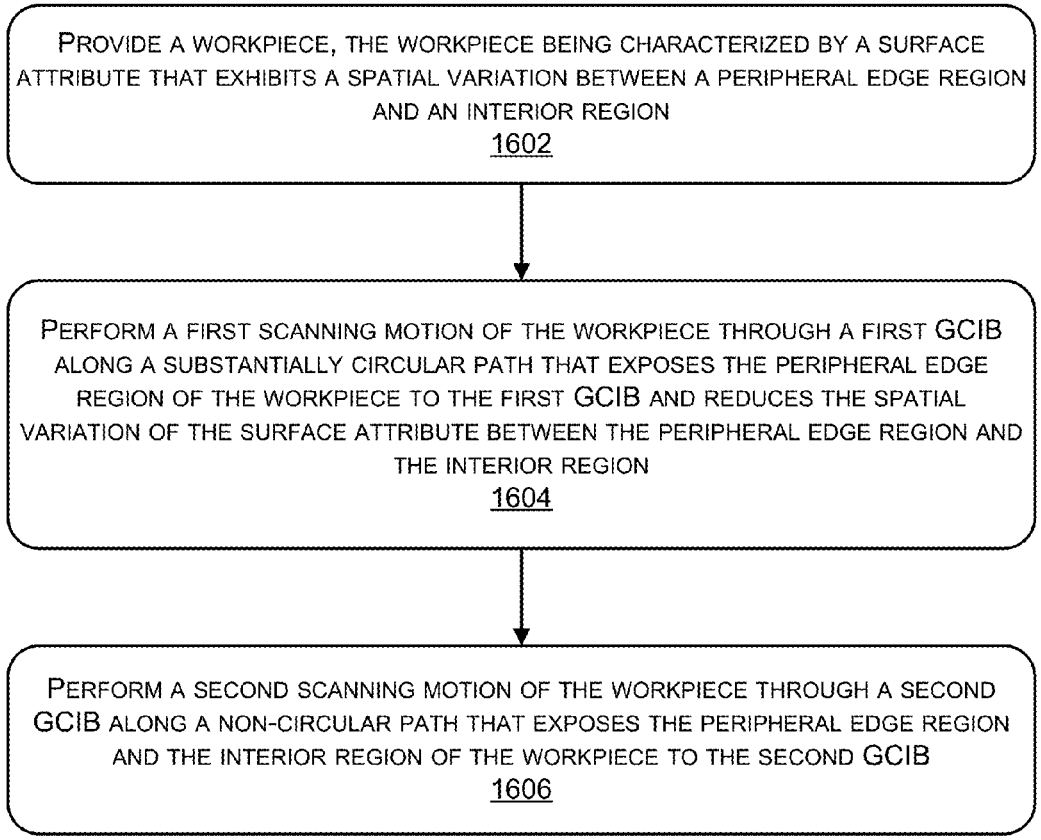
FIG. 16 illustrates an exemplary method of implementing the circular scan of the substrate using a GCIB system.

FIG. 16 illustrates one exemplary method of implementing the circular scan of the substrate 152 using a GCIB processing system 100. Substrates 152 may have a non-uniform thickness profile that may impact subsequent processes in a manner that may impact device yield and/or performance. In one embodiment, the thickness profile may have higher thickness near the edge of the substrate than at the interior portions of the substrate 152. One approach may be to develop an etch process that has a higher etch rate at the edge than at the center of the substrate 152. Another approach may be to selectively etch the thicker regions to decrease thickness non-uniformity across the substrate 152 and then uniformly etch the entire substrate 152. The GCIB processing system 100 may be used to implement the selective etch process and the subsequent uniform etch process.

At block 1602, the GCIB processing system 100 may be configured to position and secure a workpiece (e.g., substrate 152) to a workpiece scanning mechanism 500. The workpiece may composed of silicon, silicon-germanium, or any other semiconductor material. In one embodiment, the workpiece may be circular and have a radius of at least 100 mm. In one embodiment, the workpiece may include a surface attribute that exhibits a spatial variation between a peripheral edge region and an interior region of the substrate. In one specific embodiment, the surface attribute may be the thickness of the workpiece or a film on a surface of the workpiece. For example, the spatial variation may be represented by a change in thickness across workpiece or a film overlying the workpiece. The thickness profile 1400 would be one representation of that spatial variation. However, in other embodiments, the surface attribute may include, but is not limited to, a surface profile, a surface roughness, a surface composition, a surface layer composition, a mechanical property of the workpiece and/or the film, an electrical property of the workpiece and/or the film, or an optical property of the workpiece and/or the film, or any combination of two or more thereof.

As noted above, the workpiece scanning mechanism 500 may be configured to place specific portions of the workpiece in the trajectory of the GCIB 128A'.

At block 1604, the workpiece scanning mechanism 500 may perform a first scanning motion (e.g., circular motion 575) of the workpiece through a first GCIB (e.g., GCIB 128A') along a substantially circular path that exposes the peripheral edge region of the workpiece to the first GCIB. The GCIB exposure reduces the spatial variation, or other characteristic, of the surface attribute between the peripheral edge region and the interior region. An example of this reduction would be the change in thickness profile 1400. FIG. 14A may illustrate the incoming condition of the workpiece and FIG. 14B may illustrate the post first scanning condition of the workpiece.

In one embodiment, the first scanning motion may include the workpiece scanning mechanism 500 moving the workpiece along a substantially circular path that begins and ends at substantially the same location. In other embodiments, the workpiece scanning mechanism 500 may move the workpiece in series of circular motions with one or more of the circular motions having a different radius. For example, in FIG. 13, a starting radius (e.g., first radius 1302) may be the first circular motion of the first scanning motion and the ending radius (e.g., third radius 1306) may be the last circular motion of the first scanning motion. In short, the first scanning motion may include scanning the workpiece along two or more concentric circular paths. The concentric circular paths may include circles with different radii.

In another embodiment, the first scanning motion of workpiece scanning mechanism 500 may include mounting the workpiece at a first end of an elongated member (e.g., scanning arm 540). The elongated member may be rotated using a rotational mechanism (e.g., fast-scan motor 550) attached to a point of rotation. In one specific embodiment, the point of rotation may be away from the end of the elongated member.

The workpiece scanning mechanism 500 may move the elongated member and rotational mechanism along with a slow-scan mechanism 560 concurrently with the rotating. This movement may cause different portions of the peripheral edge region of the workpiece to pass through the first GCIB, tracing a substantially circular path. In addition to the circular movement, the characteristics of the first GCIB 128A' may also be varied. The characteristics may include, but are not limited to, dose and/or energy.

The completed first scanning should change the surface attribute along the peripheral region of the workpiece. In one instance, the surface attribute along the peripheral region may be more similar to the interior workpiece surface attributes. Accordingly, subsequent processing may be applied to the entire workpiece and not just the peripheral region.

At block 1608, the workpiece scanning mechanism 500 may perform a second scanning motion of the workpiece through a second GCIB along a non-circular path that exposes the peripheral edge region and the interior region of the workpiece to the second GCIB. The second scanning motion may include repetitively scanning the workpiece along a linear or arcuate path across the workpiece.

The second scanning motion may include mounting the workpiece at a first end of an elongated member of the workpiece scanning mechanism 500. Then partially, repetitively rotating the elongated member using a rotational mechanism attached to a point of rotation on the elongated member. The point of rotation may be away from the first end that makes one or more scans of the workpiece follow an arcuate path (e.g., an arc that doesn't completely form a circle). The second scanning motion may also include moving the elongated member and rotational mechanism along with a slow-scan mechanism, to which the rotational mechanism is attached and suspended from. As a result, the second scanning motion causes different portions of the workpiece to pass through the second GCIB path during the repetitive scans. In one specific embodiment, the characteristics of the second GCIB may also be varied. The characteristics may include, but are not limited to, dose and/or energy and the first GCIB differs from the second GCIB in at least one GCIB parameter.

Figure 17:
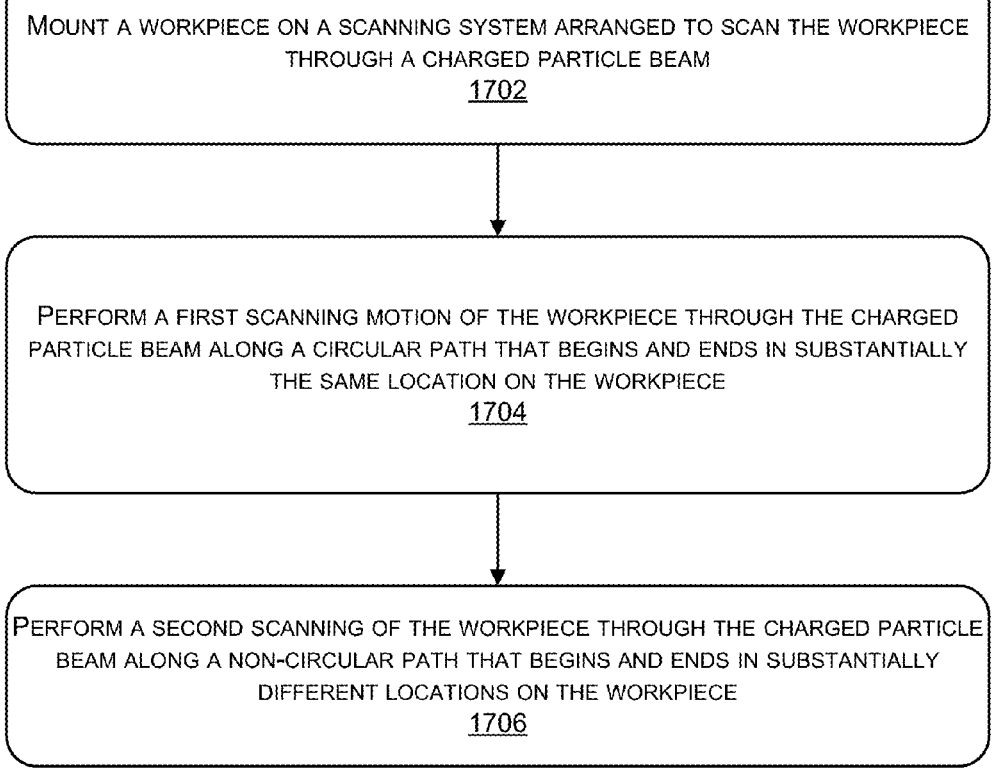
FIG. 17 illustrates another exemplary method of implementing the circular scan of the substrate using a GCIB system.

FIG. 17 illustrates another exemplary method of implementing the circular scan 1100 of the substrate 152 using a GCIB processing system 100.

At block 1702, mounting a workpiece on a scanning system (e.g., workpiece scanning mechanism 500) that may be arranged to scan the workpiece through a charged particle beam. In one embodiment, the charged particle beam may include, but is not limited to, a gas cluster ion beam (GCIB).

At block 1704, the scanning system may perform a first scanning motion of the workpiece through the charged particle beam along at least one circular path. The circular paths may begin and end in substantially the same location on the workpiece. However, the circular paths may have different radii of curvature. As noted above in the description of FIG. 13, the circular path may extend along a peripheral edge region of the workpiece. In one specific embodiment, the peripheral region may include the region up to 10 mm from the edge of the workpiece. As noted above in the description of FIG. 11, the charge particle beam may change the surface attributes of the workpiece in the peripheral region without substantially altering the surface attributes of an interior region of the workpiece. Accordingly, the surface attributes of the peripheral region and the interior region may be more similar to each other when the first scanning is completed.

At block 1706, the scanning system may perform a second scanning of the workpiece through the charged particle beam along a non-circular path that begins and ends in substantially different locations on the workpiece. The non-circular path may extend along a linear or arcuate path across the workpiece.

Figure 18:
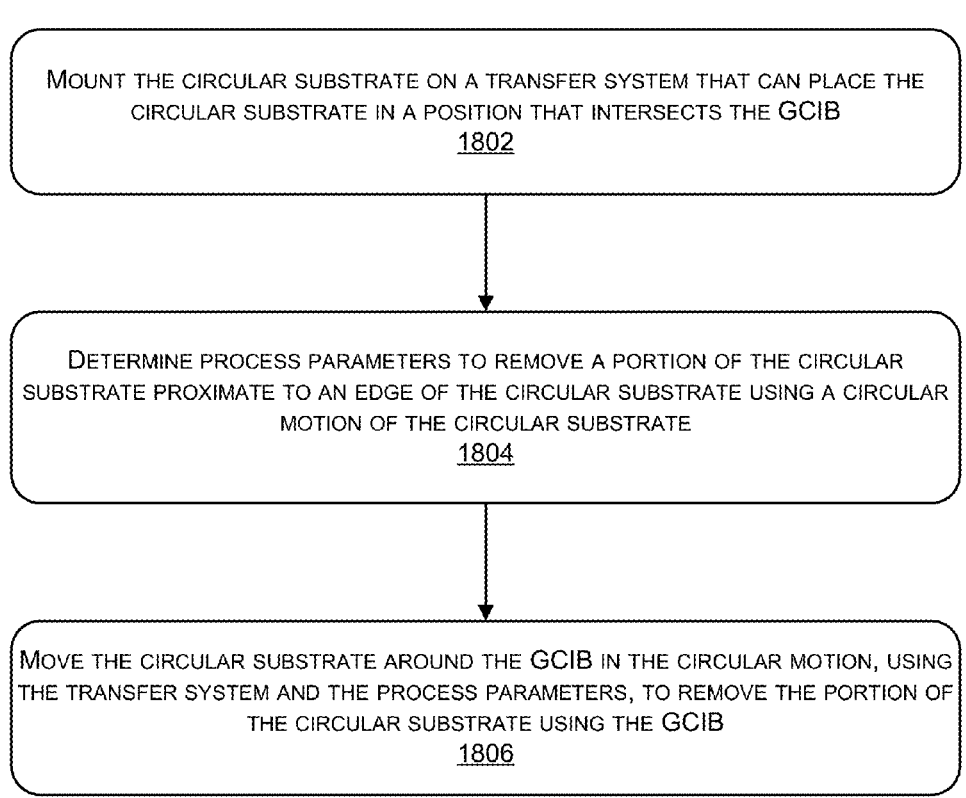
FIG. 18 illustrates another exemplary method of implementing the circular scan of the substrate using a GCIB system.

FIG. 18 illustrates another exemplary method of implementing the circular scan 1100 of the substrate 152 using a GCIB processing system 100. In one embodiment, the selective etching may be performed by the GCIB processing system 100. However, subsequent processing may be performed on other equipment that may not be able to implement a GCIB process. In this instance, the GCIB processing system 100 may prepare the substrate 152 for additional processing that may not require a second scan as described above in the descriptions of FIGS. 16 and 17. Further, the parameters related to determining to process the circular scan may also be performed on the GCIB processing system 100. One implementation of that embodiment is illustrated in FIG. 18.

At block 1802, the GCIB processing system 100 may mount the substrate 152 on a transfer system (e.g., workpiece scanning mechanism 500) that can place the substrate in a position that intersects the GCIB 128A' or is proximate to the GCIB 128A'.

At block 1804, the GCIB processing system 100 may determine or receive process parameters that may be used to remove a portion of the substrate proximate to an edge of the substrate by using a rotational motion of the substrate 152. The process parameters may include, but are not limited to, the number scans made by the GCIB processing system 100, the scan intervals, the scan speed, the starting radius of the scans, and the ending radius of the scans. In one embodiment, the starting radius and the ending radius are based, at least in part, on a radius of the substrate that is measured from a location on the substrate. The location may be the center of the substrate 152 when the substrate is circular. For example, the starting radius (e.g., first radius 1302) may comprise a distance from the center of the substrate 152 to the GCIB 128A' when the moving of the substrate around the GCIB 128A' begins. The ending radius (e.g., third radius 1306) may be the distance between the center of the substrate 152 and where the GCIB 128A' is located when the moving of the substrate 152 ends.

In one embodiment, the process parameters may be based, at least in part, on a thickness profile of the substrate 152 and characteristics of the GCIB. The process parameters may be determined to etch or deposit a film to minimize the differences of the surface attributes of the substrate 152 from the interior to the periphery. As noted above in the description of FIG. 15, the process parameters may be optimized to generate the GCIB energy profile 1500 that is likely to remove peripheral portions of the substrate 152. In addition to the aforementioned process parameters, the characteristics of the GCIB 128A' may also be varied to implement the GCIB energy profile 1500. In one embodiment, the characteristics may include, but are not limited to, beam profile, dose, energy, chemistry, or any combination thereof. In one specific embodiment, the beam profile may comprise a substantially constant or flat portion in the center of the beam and sloped portions around the GCIB 128A' periphery. In this way, the beam profile may comprises a first portion that includes substantially constant GCIB conditions and a second portion that includes GCIB conditions that change a higher rate, as a function of distance, than the first portion. This effect may be illustrated by the Gaussian curve shown in FIG. 11.

At block 1806, the GCIB processing system 100 may move the substrate around the GCIB 128A' in the rotational motion by using the transfer system and the process parameters. The circular motion coupled with the GCIB 128A' may remove the portion of the substrate 152 that intersects the GCIB 128A'.

In one embodiment, the moving of the substrate may include placing the substrate proximate to GCIB 128A' such that the GCIB 128A' is located at or within the starting radius from the center of the substrate 152. The GCIB processing system 100 may vary the radius of the circular motions being made by the substrate 152, such that the GCIB 128A' may treat the peripheral region of the substrate 152. When the peripheral region has completed treatment, the GCIB processing system disengages the GCIB 128A' from the substrate 152. The treatment may be completed when the circular scan radius is the same or similar to the ending radius.

In another embodiment, the GCIB processing system 100 may include computer-executable instructions that may be executed by a computer processor. For example, the computer-executable instructions may be used to implement any portion or all of the methods described above.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the figures. It is therefore intended that the scope of the invention be limited not by this detailed description, but rather by the claims appended hereto.

What is claimed is:

1. A method for treating a workpiece with a gas cluster ion beam (GCIB), comprising:
   providing a workpiece, the workpiece being characterized by a surface attribute that exhibits a spatial variation between a peripheral edge region and an interior region;
   performing a first scanning motion of the workpiece through a first GCIB along a rotational path that exposes the peripheral edge region of the workpiece to the first GCIB and reduces the spatial variation of the surface attribute between the peripheral edge region and the interior region; and
   performing a second scanning motion of the workpiece through a second GCIB along a non-circular path that exposes the peripheral edge region and the interior region of the workpiece to the second GCIB.

2. The method of claim 1, wherein the surface attribute comprises a film thickness, a surface profile, a surface roughness, a surface composition, a layer composition, a mechanical property of the workpiece, an electrical property of the workpiece, or an optical property of the workpiece, or any combination of two or more thereof.

3. The method of claim 1, wherein the first GCIB differs from the second GCIB in at least one GCIB parameter.

4. The method of claim 1, wherein the performing the first scanning motion comprises scanning the workpiece along a substantially circular path that begins and ends at the same or similar location.

5. The method of claim 1, wherein the performing the first scanning motion comprises scanning the workpiece along two or more concentric circular paths.

6. The method of claim 1, wherein the performing the first scanning motion comprises repetitively scanning the workpiece along a substantially circular path.

7. The method of claim 1, wherein the performing the second scanning motion comprises repetitively scanning the workpiece along a linear or arcuate path across the workpiece.

8. The method of claim 1, wherein the performing the first scanning motion comprises:
   mounting the workpiece at a first end of an elongated member;
   rotating the elongated member using a rotational mechanism attached to a point of rotation on the elongated member, the point of rotation being away from the first end, to make one or more scans of the workpiece through the first GCIB;
   moving the elongated member and rotational mechanism along a slow-scan mechanism concurrently with the rotating, to which the rotational mechanism is attached and by which is suspended, the moving causing different portions of the peripheral edge region of the workpiece to pass through the first GCIB, along a rotational path.

9. The method of claim 1, wherein the performing the second scanning motion comprises:
   mounting the workpiece at a first end of an elongated member;
   partially, repetitively rotating the elongated member using a rotational mechanism attached to a point of rotation on the elongated member, the point of rotation being away from the first end, to make one or more scans of the workpiece through the second GCIB, along an arcuate path;

moving the elongated member and rotational mechanism along a slow-scan mechanism, to which the rotational mechanism is attached and by which is suspended, the moving causing different portions of the workpiece to pass through the second GCIB path during the repetitive scans.

10. The method of claim 1, further comprising varying a first GCIB dose during the performing the first scanning motion.

11. The method of claim 1, further comprising varying a second GCIB dose during the performing the second scanning motion.

* * * * *